(12) United States Patent
Liang et al.

(10) Patent No.: US 11,676,773 B2
(45) Date of Patent: *Jun. 13, 2023

(54) CARBON-TITANIA NANOCOMPOSITE THIN FILMS AND APPLICATIONS OF THE SAME

(71) Applicant: NORTHWESTERN UNIVERSITY, Evanston, IL (US)

(72) Inventors: Yu Teng Liang, Chicago, IL (US); Baiju K. Vijayan, Kerala (IN); Kimberly A. Gray, Evanston, IL (US); Mark C. Hersam, Wilmette, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/518,690

(22) Filed: Nov. 4, 2021

(65) Prior Publication Data
US 2022/0076898 A1    Mar. 10, 2022

Related U.S. Application Data

(62) Division of application No. 15/181,802, filed on Jun. 14, 2016, now Pat. No. 11,195,667, which is a
(Continued)

(51) Int. Cl.
*H01G 9/20* (2006.01)
*C01G 23/053* (2006.01)
(Continued)

(52) U.S. Cl.
CPC .......... *H01G 9/2022* (2013.01); *B01J 35/004* (2013.01); *B82Y 30/00* (2013.01); *B82Y 40/00* (2013.01); *C01B 32/19* (2017.08); *C01B 32/192* (2017.08); *C01G 23/053* (2013.01); *C09D 11/52* (2013.01); *H01L 21/00* (2013.01); *B01J 21/18* (2013.01); *C01P 2004/03* (2013.01);
(Continued)

(58) Field of Classification Search
CPC .................................................... H01G 9/2022
See application file for complete search history.

(56) References Cited

PUBLICATIONS

Liang et al, Highly Concentrated Graphene Solutions via Polymer Enhanced Solvent Exfoliation and Iterative Solvent Exchange, Aug. 24, 2010, Journal of American Chemical Society, vol. 132, p. 17661-17663.*

(Continued)

*Primary Examiner* — Bethany L Martin
(74) *Attorney, Agent, or Firm* — Locke Lord LLP; Tim Tingkang Xia, Esq.

(57) ABSTRACT

In one aspect of the invention, a dye sensitized solar cell has a counter-electrode including carbon-titania nanocomposite thin films made by forming a carbon-based ink; forming a titania ($TiO_2$) solution; blade-coating a mechanical mixture of the carbon-based ink and the titania solution onto a substrate; and annealing the blade-coated substrate at a first temperature for a first period of time to obtain the carbon-based titania nanocomposite thin films. In certain embodiments, the carbon-based titania nanocomposite thin films may include solvent-exfoliated graphene titania ($SEG-TiO_2$) nanocomposite thin films, or single walled carbon nanotube titania ($SWCNT-TiO_2$) nanocomposite thin films.

8 Claims, 23 Drawing Sheets

Related U.S. Application Data division of application No. 13/745,092, filed on Jan. 18, 2013, now Pat. No. 9,393,550.

(60) Provisional application No. 61/588,059, filed on Jan. 18, 2012.

(51) Int. Cl.

| | |
|---|---|
| *B01J 35/00* | (2006.01) |
| *C01B 32/19* | (2017.01) |
| *C01B 32/192* | (2017.01) |
| *B01J 21/18* | (2006.01) |
| *H01L 21/00* | (2006.01) |
| *B82Y 30/00* | (2011.01) |
| *B82Y 40/00* | (2011.01) |
| *C09D 11/52* | (2014.01) |

(52) U.S. Cl.
CPC ...... *C01P 2004/04* (2013.01); *C01P 2004/24* (2013.01); *Y02E 10/542* (2013.01); *Y02P 70/50* (2015.11)

(56) References Cited

PUBLICATIONS

Manga et al, Multilayer Hybrid Films Consisting of Alternating Graphene and Titania Nanosheets with Ultrafast Electron Transfer and Photoconversion Properties, Advanced Funtional Materials, 2009, p. 3638-3643.*

Tang et al, Incorporation of Graphenes in Nanostructured TiO2 Films via Molecular Grafting for Dye-Sensitized Solar Cell Application, American Chemical Society, Nano, 2010 vol. 4, No. 6 pp. 3482-3488.*

* cited by examiner

CARBON-TITANIA NANOCOMPOSITE THIN FILMS AND APPLICATIONS OF THE SAME

CROSS-REFERENCE TO RELATED PATENT APPLICATIONS

This application is a divisional application of and claims the benefit of U.S. patent application Ser. No. 15/181,802, filed Jun. 14, 2016, now allowed, which is a divisional application of and claims the benefit of U.S. patent application Ser. No. 13/745,092, filed Jan. 18, 2013, now U.S. Pat. No. 9,393,550, which itself claims priority to and the benefit of U.S. Provisional Patent Application Ser. No. 61/588,059, filed Jan. 18, 2012, which are incorporated herein in their entireties by reference.

STATEMENT AS TO RIGHTS UNDER FEDERALLY-SPONSORED RESEARCH

This invention was made with government support under DE-FG02-03ER15457 awarded by Department of Energy. The government has certain rights in the invention.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "$n$" represents the nth reference cited in the reference list. For example, superscript [29] represents the 29th reference cited in the reference list, namely, Ostojic, G. N.; Liang, Y. T.; Hersam, M. C. *Nanotechnology* 2009, 20, 434019.

FIELD OF THE INVENTION

The present invention relates generally to carbon-titania nanocomposites, and more particularly to carbon-titania nanocomposite thin films with improved photoactivities, such as graphene-titania or carbon nanotube-titania nanocomposite thin films, and applications of the same.

BACKGROUND OF THE INVENTION

The photocatalytic activity of wide bandgap semiconductors has been the subject of numerous studies due to their ability to simultaneously harvest solar energy and drive chemical reactions via photoexcited charge carriers and activated electronic states.[1-3] Among these materials, titanium dioxide ($TiO_2$), also known as titania, is particularly noteworthy because of its robust performance, nontoxicity, and chemical stability. Numerous photocatalytic applications for $TiO_2$ have been proposed including liquid and gas phase organic contaminant degradation, water photolysis, and carbon dioxide ($CO_2$) reduction.[1-4] A popular pathway for enhancing photocatalytic activity is to explore different $TiO_2$ formulations including mixtures of its two polymorphs, anatase and rutile. While anatase typically exhibits higher photocatalytic activity than rutile, precise mixtures of both phases display even better performance. For example, the most widely studied $TiO_2$ formulation is Degussa P25 $TiO_2$ (P25), which at 80% anatase and 20% rutile, produces novel electronic states at anatase-rutile junctions that result in enhanced charge carrier separation and reduced electron-hole recombination.[2,5]

More recently, further enhancements to $TiO_2$ photocatalytic activity have been demonstrated by incorporating carbon nanomaterials to form carbon-$TiO_2$ nanocomposite photocatalysts. In particular, carbon nanotubes (CNTs) and graphene, which are cylindrical and planar forms of $sp^2$ hybridized carbon, respectively, have been shown to enhance catalysis[6,7] due to their large specific surface areas, extraordinary electronic mobility,[8] and molecular stability.[9] In particular, previous studies have demonstrated the enhanced photo-oxidative degradation of organic contaminants for both CNT-based and graphene-based $TiO_2$ nanocomposites.[6,7,10-12] In these cases, the improved reactivity was attributed to the extended optical absorption, resulting from surface impurity doping, and increased lifetimes of the $TiO_2$ confined holes, due to the injection of photoexcited electrons into the carbon nanomaterial.[6,10] However, since these photo-oxidative reactions occur primarily on the unmodified $TiO_2$ surface, few discernable differences have been reported between nanocomposites based on different carbon polymorphs.[11]

Recent advances in the solution-phase isolation of graphene from graphite[13-18] have motivated its study and use in photocatalytic nanocomposites. These solution-phase methods can be classified in two qualitatively different categories. The first and most commonly used strategy involves the covalent modification of graphite via acidic treatments to form an intermediary product that is frequently referred to as graphene oxide (GO). The GO nanoplatelets are then reduced through additional thermal,[19] optical,[20,21] or chemical means[15] that partially restore $sp^2$ hybridization to yield reduced graphene oxide (RGO).[16] The second pathway employs ultrasonic energy to directly exfoliate graphite in suitable solvents.[17,18] Sedimentation steps are then utilized to isolate the thinnest platelets to yield solvent-exfoliated graphene (SEG) dispersions. Recent studies have uncovered significant structural and chemical defects that distinguish RGO and SEG from both the ideal graphene crystal and one another.[18,22] Since these defects produce unique electronic[23,24] and optical[25] states, they are likely to influence and perhaps even enhance photocatalysis.[26]

Further, recent developments in low-dimensional nanomaterial synthesis have enabled their incorporation and study in a broad range of technologies. In particular, single walled carbon nanotubes (SWCNTs) and graphene, one and two-dimensional forms of $sp^2$ hybridized carbon, respectively, have been utilized in high-performance transistors with high on/off ratios and frequencies exceeding 100 GHz.[34-36] Concurrently, materials chemists have developed techniques to manipulate the geometry and direct the assembly of low-dimensional inorganic nanocrystals.[37-40] By controlling their surface energies, highly monodisperse nanocrystal populations can be produced with tailored optoelectronic[37,41], and catalytic[42] properties. While isolated nanomaterials in pristine conditions are suitable for fundamental studies, most applications require integration into composite structures and operation in ambient environments. Consequently, precise understanding and control of nanomaterial surfaces and interfaces are needed to realize their full potential in practical settings.[43] For example, the transfer of graphene onto flat boron nitride substrates results in increased electron mobility,[44] and the preferential growth of (001) surfaces enhances the photoactivity of titania nanosheets (TINS).[42,45,46]

Due to its ability to degrade organic pollutants and produce chemical fuels using radiant energy, photocatalysis represents an attractive opportunity to utilize the unique optoelectronic properties and large specific surface areas of low-dimensional nanomaterials.[47-63] In particular, nanocarbon-titania ($TiO_2$) composites have been the subject of extensive investigation due to their ability to increase reactive charge carrier lifetimes and extend optical absorption into the visible spectrum.[53-58] Various composites have been produced from combinations of $TiO_2$ with SWCNT, solvent exfoliated graphene (SEG), or reduced graphene oxide (RGO).[50-55,60,64-66] Recent work has shown that titania composite photocatalysts derived from SEG, which have low carbon defect densities, outperform those derived from RGO, which have high carbon defect densities, due to stronger optoelectronic coupling.[53] However, the interfacial charge transfer interactions between $TiO_2$ and different carbon nanomaterials are not completely understood.[53,57,59,60] The high photoactivity and 2D geometry of recently discovered titania nanosheets (TiNS) provides a unique opportunity to engineer higher catalytic efficiencies and understand nanomaterial coupling in carbon-$TiO_2$ nanocomposites.

Therefore, a heretofore unaddressed need exists in the art to address the aforementioned deficiencies and inadequacies.

SUMMARY OF THE INVENTION

In one aspect of the disclosure, a method of making non-covalently bonded carbon-titania nanocomposite thin films includes: forming a carbon-based ink; forming a titania ($TiO_2$) solution; blade-coating a mechanical mixture of the carbon-based ink and the titania solution onto a substrate; and annealing the blade-coated substrate at a first temperature for a first period of time to obtain the carbon-based titania nanocomposite thin films. In certain embodiments, the carbon-based ink may include a concentrated solvent-exfoliated graphene (SEG) ink, or a concentrated single walled carbon nanotube (SWCNT) ink.

In one embodiment, the first temperature is about 350-450° C., and the first period of time is about 20-45 minutes.

In one embodiment, the carbon-based ink includes a concentrated SEG ink. In one embodiment, the forming of the concentrated SEG ink includes: adding a first amount of natural graphite to a second amount of N,N-dimethylformamide (DMF) to form a first graphite solution; sonicating the first graphite solution at a first frequency for a second period of time; centrifuging the sonicated first graphite solution for a third period of time at a first rotation speed to obtain a SEG supernatant; and disposing the SEG supernatant in ethyl-cellulose (EC) and terpineol, and evaporating the DMF in the SEG solution to form the concentrated SEG ink. In one embodiment, the first amount is about 2-3 g, the second amount is about 40-60 ml, the second period of time is about 2.5-3.5 hours, the first frequency is about 30-50 kHz, the third period of time is about 3-6 hours, and the first rotation speed is about 6000-9000 rpm.

In a further embodiment, the forming of the concentrated SEG ink includes: adding natural graphite to an EC-ethanol solution to form a second graphite solution; sonicating the second graphite solution at a second frequency for a fourth period of time; centrifuging the sonicated second graphite solution for a fifth period of time at a second rotation speed to obtain a SEG supernatant; and disposing the SEG supernatant in terpineol to perform solvent exchange and to form the concentrated SEG ink. In one embodiment, the fourth period of time is about 2.5-3.5 hours, the first frequency is about 30-50 kHz, the fifth period of time is about 3-6 hours, and the second rotation speed is about 6000-9000 rpm.

In one embodiment, the carbon-based ink includes a concentrated SWCNT ink. In one embodiment, the forming of the concentrated SWCNT ink includes: dispersing SWCNT in an EC-ethanol solution to form a SWCNT solution; sonicating the SWCNT solution for a sixth period of time; and disposing the sonicated SWCNT solution in terpineol to perform solvent exchange and to obtain the concentrated SWCNT ink. In one embodiment, the sixth period of time is about 45-75 minutes.

In one embodiment, the titania solution includes a titanium dioxide P25 ink.

In one embodiment, the titania solution includes a titania nanosheet (TiNS) ink. In one embodiment, the forming of the TiNS ink includes: mixing a seventh amount of titanium butoxide with an eighth amount of hydrofluoric acid for a seventh period of time to form a mixed solution; heating the mixed solution at a fourth temperature for an eighth period of time under hydrothermal conditions; and rinsing the heated mixed solution to obtain the TiNS ink. In one embodiment, the seventh amount is about 15-25 ml, the eighth amount is about 2.5-3.2 ml, the seventh period of time is about 20-45 minutes, the fourth temperature is about 175-225° C., and the eighth period of time is about 20-28 hours.

Another aspect of the disclosure relates to a method of making solvent-exfoliated graphene titania (SEG-$TiO_2$) nanocomposite thin films, including: adding a first amount of natural graphite to a second amount of N,N-dimethylformamide (DMF) to form a graphite solution; sonicating the graphite solution at about 30-50 kHz for about 2.5-3.5 hours; centrifuging the sonicated graphite solution for about 3-6 hours at about 6000-9000 rpm to obtain a SEG supernatant; disposing the SEG supernatant in ethyl-cellulose (EC) and terpineol, and evaporating the DMF in the SEG solution to form a concentrated SEG ink; forming a titania solution; blade-coating a mechanical mixture of the concentrated SEG ink and the titania solution onto a substrate; and annealing the blade-coated substrate at about 350-450° C. for about 20-45 minutes to obtain the SEG-$TiO_2$ nanocomposite thin films.

In one embodiment, the first amount is about 2-3 g, and the second amount is about 40-60 ml.

In one embodiment, the titania solution includes a titanium dioxide P25 ink.

In one embodiment, the titania solution comprises a titania nanosheet (TiNS) ink. In one embodiment, the forming of the TiNS ink includes: mixing a third amount of titanium butoxide with a fourth amount of hydrofluoric acid for about 20-45 minutes to form a mixed solution; heating the mixed solution at about 175-225° C. for about 20-28 hours under hydrothermal conditions; and rinsing the heated mixed solution to obtain the TiNS ink. In one embodiment, the third amount is about 15-25 ml, and the fourth amount is about 2.5-3.2 ml.

Another aspect of the disclosure relates to a method of making SEG-$TiO_2$ nanocomposite thin films, including: adding a first amount of natural graphite to a second amount of an EC-ethanol solution to form a graphite solution; sonicating the graphite solution at a predetermined frequency for a first period of time; centrifuging the sonicated graphite solution for a second period of time at a predetermined speed to obtain a SEG supernatant; disposing the SEG supernatant in terpineol to perform solvent exchange and to form the concentrated SEG ink; forming a titania solution; blade-coating a mechanical mixture of the concentrated SEG ink and the titania solution onto a substrate; and annealing the blade-coated substrate at a predetermined temperature for a third period of time to obtain the SEG-TiO$_2$ nanocomposite thin films.

In one embodiment, the first period of time is about 2.5-3.5 hours; the second period of time is about 3-6 hours; the third period of time is about 20-45 minutes; the predetermined frequency is about 30-50 kHz; the predetermined speed is about 6000-9000 rpm; and the predetermined temperature is about 350-450° C.

In one embodiment, the titania solution includes a titanium dioxide P25 ink.

In one embodiment, the titania solution comprises a titania nanosheet (TiNS) ink. In one embodiment, the forming of the TiNS ink includes: mixing a third amount of titanium butoxide with a fourth amount of hydrofluoric acid for about 20-45 minutes to form a mixed solution; heating the mixed solution at about 175-225° C. for about 20-28 hours under hydrothermal conditions; and rinsing the heated mixed solution to obtain the TiNS ink. In one embodiment, the third amount is about 15-25 ml, and the fourth amount is about 2.5-3.2 ml.

In another aspect, a SEG-TiO$_2$ nanocomposite thin film is made by the methods as disclosed above.

In one aspect of the disclosure, a method of making single walled carbon nanotube titania (SWCNT-TiO$_2$) nanocomposite thin films includes: dispersing single walled carbon nanotubes (SWCNTs) in an ethyl-cellulose (EC)-ethanol solution to form a SWCNT solution; sonicating the SWCNT solution for about 45-75 minutes; disposing the sonicated SWCNT solution in terpineol to perform solvent exchange and to obtain the concentrated SWCNT ink; forming a titania solution; blade-coating a mechanical mixture of the concentrated SWCNT ink and the titania solution onto a substrate; and annealing the blade-coated substrate at about 350-450° C. for about 20-45 minutes to obtain the SWCNT-TiO$_2$ nanocomposite thin films.

In one embodiment, the titania solution comprises a TiNS ink. In one embodiment, the forming of the TiNS ink includes: mixing a first amount of titanium butoxide with a second amount of hydrofluoric acid for about 20-45 minutes to form a mixed solution; heating the mixed solution at about 175-225° C. for about 20-28 hours under hydrothermal conditions; and rinsing the heated mixed solution to obtain the TiNS ink. In one embodiment, the first amount is about 15-25 ml, and the second amount is about 2.5-3.2 ml.

In yet a further aspect, a SWCNT-TiO$_2$ nanocomposite thin film is made by the method as disclosed above.

Another aspect of the present invention relates to a dye sensitized solar cell, having a counter-electrode formed by the graphene nanocomposite thin films made by one of the methods as disclosed above.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
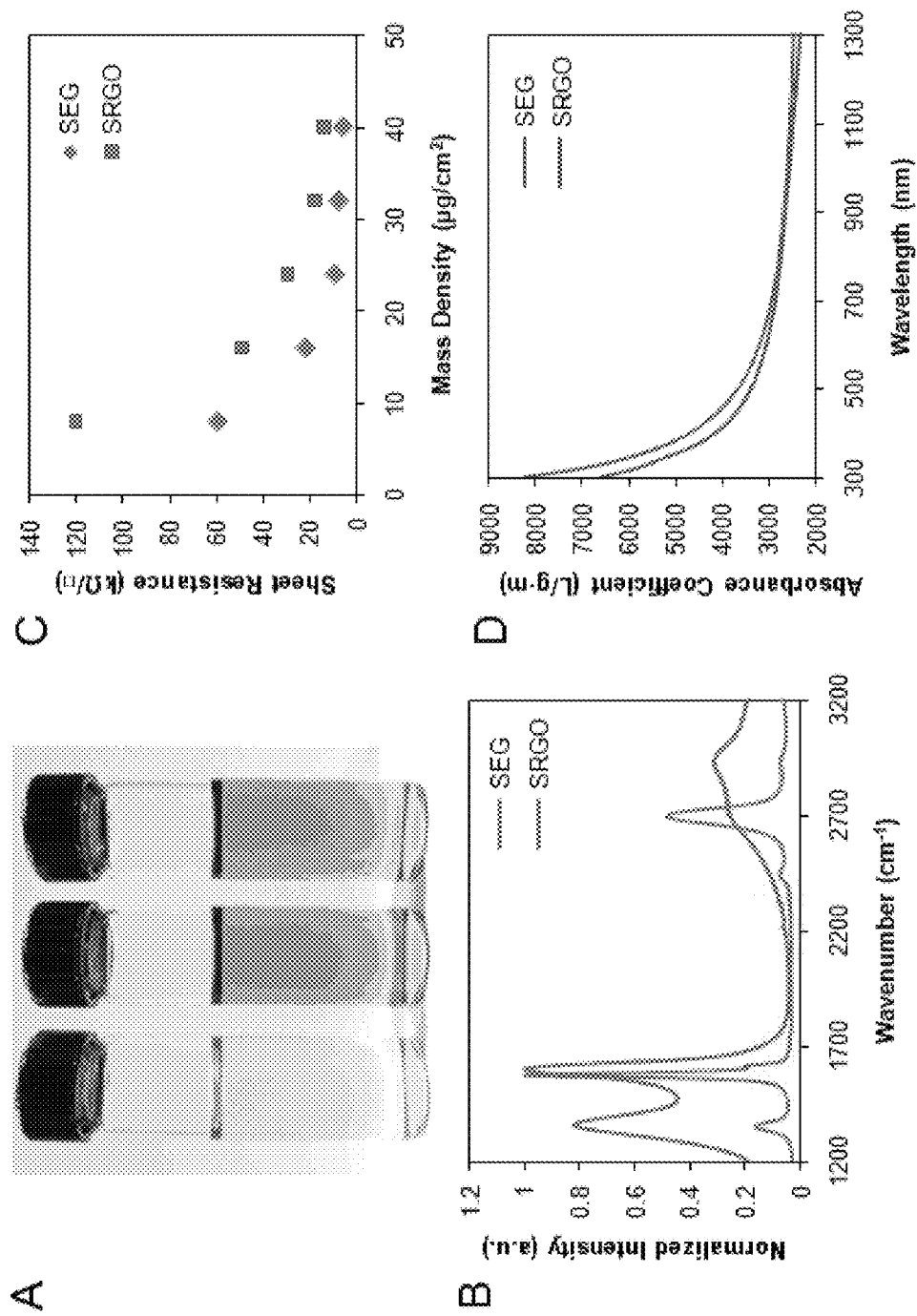
FIG. 1 shows schematically characterization of solvent-reduced graphene oxide (SRGO) and solvent-exfoliated graphene (SEG) according to one or more embodiments of the disclosure, where (A) shows photographs of graphene oxide, SRGO, and SEG (from left to right) dispersions in DMF at 0.01 mg/mL; (B) shows intensity-normalized Raman spectra of SEG and SRGO films annealed at 400° C. for 30 min in air; (C) shows sheet resistances of SEG and SRGO thin films formed via vacuum filtration as a function of mass density; and (D) shows optical absorbance coefficients for SEG and SRGO dispersions in DMF.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

As used herein, if any, the term "scanning electron microscope" or its abbreviation "SEM" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, a "nanostructure" refers to an object of intermediate size between molecular and microscopic (micrometer-sized) structures. In describing nanostructures, the sizes of the nanostructures refer to the number of dimensions on the nanoscale. For example, nanotextured surfaces have one dimension on the nanoscale, i.e., only the thickness of the surface of an object is between 0.1 and 1000 nm. Sphere-like nanoparticles have three dimensions on the nanoscale, i.e., the particle is between 0.1 and 1000 nm in each spatial dimension. A list of nanostructures includes, but not limited to, nanoparticle, nanocomposite, quantum dot, nanofilm, nanoshell, nanofiber, nanoring, nanorod, nanowire, nanotube, and so on.

Overview of the Invention

The present invention, in one aspect, relates to a method of making non-covalently bonded graphene-titania nanocomposite thin films with improved photoactivities. Previous graphene-based composite photocatalysts utilized reduced graphene oxide (RGO)[1,2] produced via an oxidation-reduction procedure that introduces large quantities of irreversible structural and chemical defects.[3] Furthermore, the effects of these graphene defects on catalysis remained unknown due to the complexities associated with producing pristine graphene nanocomposites. For example, macroscopic cracking was observed after filtering a titanium dioxide ($TiO_2$) and graphene dispersion onto an anodized aluminum oxide membrane. The pristine graphene-$TiO_2$ nanocomposites produced according to one or more embodiments of the present invention exhibited dramatically improved photoactivities over similar RGO-$TiO_2$ films. This improved photocatalytic activity is useful for the improved degradation of liquid and gaseous organic contaminants and the production of solar chemical fuels.

Another aspect of the disclosure relates to a method of making solvent-exfoliated graphene titania (SEG-$TiO_2$) nanocomposite thin films, including: adding a first amount of natural graphite to a second amount of N,N-dimethylformamide (DMF) to form a graphite solution; sonicating the graphite solution at about 30-50 kHz for about 2.5-3.5 hours; centrifuging the sonicated graphite solution for about 3-6 hours at about 6000-9000 rpm to obtain a SEG supernatant; disposing the SEG supernatant in ethyl-cellulose (EC) and terpineol, and evaporating the DMF in the SEG solution to form a concentrated SEG ink; forming a titania solution; blade-coating a mechanical mixture of the concentrated SEG ink and the titania solution onto a substrate; and annealing the blade-coated substrate at about 350-450° C. for about 20-45 minutes to obtain the SEG-$TiO_2$ nanocomposite thin films.

In one embodiment of the disclosure, novel SEG-$TiO_2$ nanocomposites and methods of producing these novel SEG-$TiO_2$ nanocomposites are invented, which are then compared to previously available RGO-$TiO_2$ nanocomposites in an effort to elucidate the role of graphene and its defects in the photocatalytic reduction of $CO_2$. Consistent with prior reports, we find that RGO possesses significantly higher defect density than SEG. However, in contrast to conventional wisdom regarding the importance of defects in catalysis, the less defective SEG is shown to possess higher photocatalytic activity than RGO for the reduction of $CO_2$ to $CH_4$, with up to an unexpected, surprising, seven-fold improvement compared to pure $TiO_2$ under visible illumination. Based on extensive characterization of the structural, electrical, and optical properties of SEG-$TiO_2$ and RGO-$TiO_2$, it is concluded that the improved electrical mobility of SEG facilitates photo-reduction reactions by allowing photoexcited electrons to more effectively diffuse to reactive sites. Overall, among other things, this invention provides new chemical insight into nanocomposite-based photocatalysis that can inform ongoing efforts to harness solar energy for the conversion of greenhouse gases into useful chemical fuels.

FIG. 1 shows schematically characterization of solvent-reduced graphene oxide (SRGO) and solvent-exfoliated graphene (SEG) according to one or more embodiments of the disclosure, where (A) shows photographs of graphene oxide, SRGO, and SEG (from left to right) dispersions in DMF at 0.01 mg/ml; (B) shows intensity-normalized Raman spectra of SEG and SRGO films annealed at 400° C. for 30 min in air; (C) shows sheet resistances of SEG and SRGO thin films formed via vacuum filtration as a function of mass density; and (D) shows optical absorbance coefficients for SEG and SRGO dispersions in DMF.

In one or more embodiments of the present invention, SEG dispersions were produced by adding 2.5 g of natural graphite to 50 ml of N,N-dimethylforamide (DMF) to form a graphite solution, and performing a 3-hour ultrasonic treatment to the graphite solution of the natural graphite in the DMF, followed by centrifugation of the sonicated graphite solution at 7500 rpm for 4.5 hour to remove the fast sedimenting graphite. The resulting SEG supernatant consists primarily of few-layer graphene nanoplatelets with lateral dimensions ranging from about 50 nm to 750 nm.

In comparison, graphene oxide (GO) was produced via a modified Hummers method,[27] using the same natural graphite as the source material. As shown in FIG. 1(A), thermal reduction process was then performed in DMF to produce solvent-reduced graphene oxide (SRGO) with lateral dimensions ranging from about 500 nm to 3 μm. The resulting SEG and SRGO nanoplatelets were characterized using Raman spectroscopy. Typical Raman spectra for graphene films exhibit four primary peaks: the G band at about 1590 $cm^{-1}$, 2D band at about 2700 $cm^{-1}$, and the disorder-associated D and D' bands at about 1350 $cm^{-1}$ and about 1620 $cm^{-1}$ respectively[15]. Of particular note is the intensity ratio of the D and G bands, I(D)/I(G), which is a measure of the relative concentration of $sp^3$ hybridized defects compared to the $sp^2$ hybridized graphene domains. As shown in FIG. 1(B), the average I(D)/I(G) value for the annealed SEG films is 0.17, which is significantly lower than 0.82 for the annealed SRGO films, thus indicating the higher defect density of SRGO compared to SEG.

The electrical and optical properties of SEG and SRGO were characterized using four-point probe sheet resistance measurements and UV-Vis-NIR optical absorbance spectroscopy. Sheet resistance was assessed for both SEG and SRGO films formed via vacuum filtration. As shown in FIG. 1(C), consistent with their higher defect density, sheet resistances for SRGO films were on average 2.4 times higher than SEG films at the same areal mass density. As shown in FIG. 1(D), spectrally resolved optical absorbance measurements reveal that SRGO closely follows SEG in the near-infrared region but is slightly more transparent at ultraviolet and visible wavelengths. In addition, a small optical absorbance feature is observed for SRGO dispersions at about 350 nm. However, these subtle differences between the SEG and SRGO optical characteristics are unlikely to result in significant differences between their photocatalytic properties.

Graphene nanocomposite synthesis typically employs covalent chemistry to attach inorganic nanoparticles onto the graphene surface.[7,11,28] However, since covalently bound nanocomposites require either the presence or introduction of defects, only those based on highly defective SRGO nanoplatelets have been produced.[28] While vacuum filtration offers one potential path towards the synthesis of non-covalently modified SEG composites,[29] the co-filtration of SEG and P25 yielded films with macroscopic fissures upon drying. Therefore, in one aspect, a novel scheme for producing SEG and SRGO nanocomposite films is devised, using ethyl-cellulose (EC) as a stabilizing and film-forming polymer.[13] Highly concentrated SEG and SRGO inks were generated by removing DMF in the presence of EC and terpineol. A titanium oxide P25 ink (hereinafter the "P25 ink") was also prepared following a previously established protocol.[30] Mechanical mixtures of these inks were then blade coated onto 1 mm thick silica glass substrates and annealed at 400° C. for 30 min, which removes carbonaceous impurities to produce SEG-P25 and SRGO-P25 nanocomposite thin films.

Figure 2:
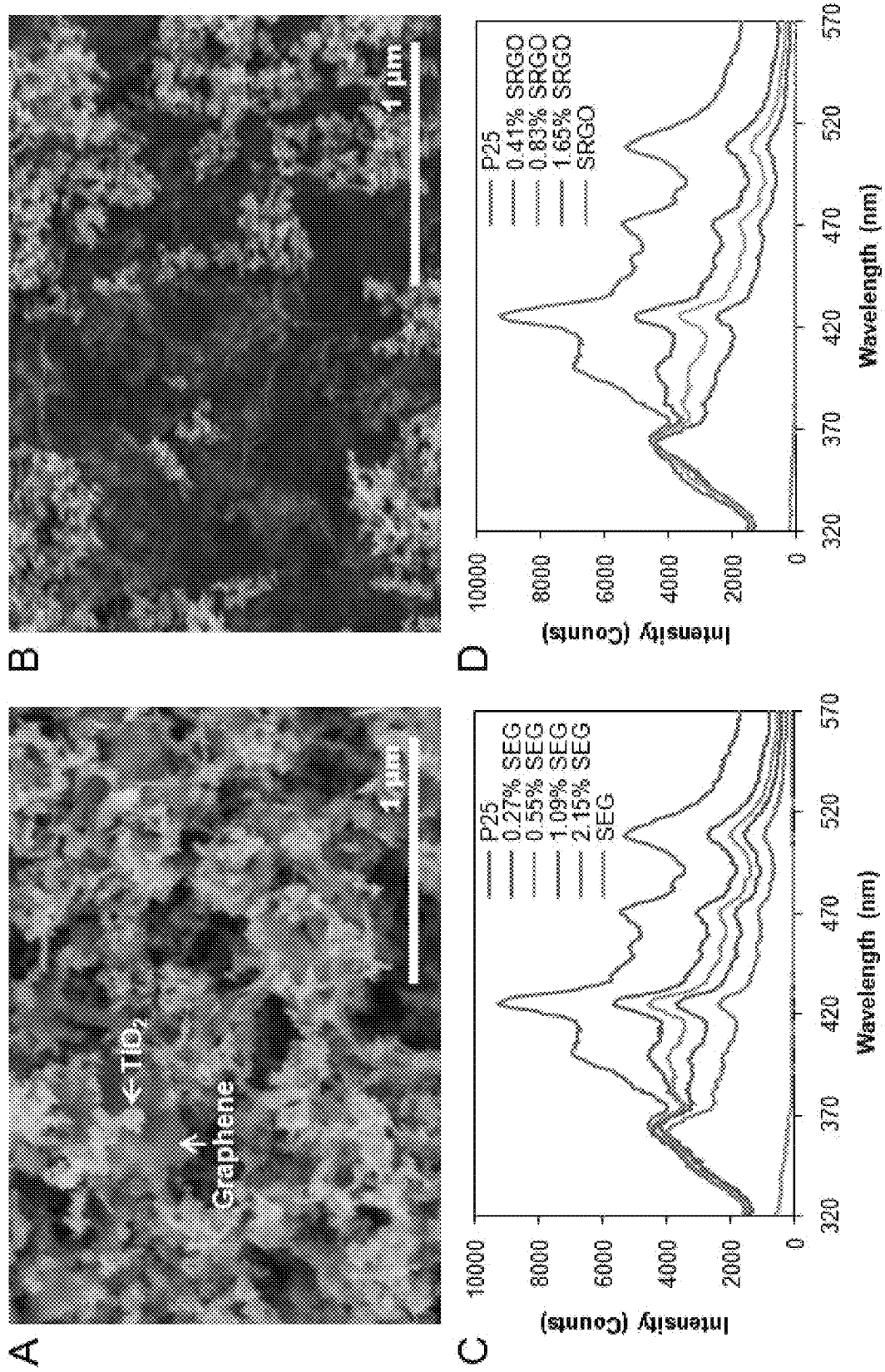
FIG. 2 shows schematically characterization of SEG-P25 and SRGO-P25 nanocomposites according to one or more embodiments of the present invention, where (A) shows a scanning electron micrograph of an annealed SEG-P25 nanocomposite showing its highly porous and homogenous microstructure; (B) shows a scanning electron micrograph of an annealed SRGO-P25 nanocomposite showing TiO$_2$ nanoparticles both above and below the embedded SRGO nanoplatelet; (C) shows photoluminescence (PL) spectra of the PL quenching of P25 by SEG; and (D) shows PL spectra of the PL quenching of P25 by SRGO.

FIG. 2 shows schematically characterization of SEG-P25 and SRGO-P25 nanocomposites according to one or more embodiments of the present invention, where (A) shows a scanning electron micrograph of an annealed SEG-P25 nanocomposite showing its highly porous and homogenous microstructure; (B) shows a scanning electron micrograph of an annealed SRGO-P25 nanocomposite showing $TiO_2$ nanoparticles both above and below the embedded SRGO nanoplatelet; (C) shows photoluminescence (PL) spectra of the PL quenching of P25 by SEG; and (D) shows PL spectra of the PL quenching of P25 by SRGO.

As shown in FIG. 2(A), the SEMs reveal the homogenous structure of the nanocomposite thin films generated by this process. The SEG-P25 film has a porous network of SEG nanoplatelets decorated with P25 $TiO_2$ particles that are about 21 nm in average diameter. In comparison, for the SRGO-P25 films, the larger SRGO nanoplatelets are similarly embedded into the porous P25 network. As shown in FIG. 2(B), with the SEM, P25 nanoparticles can be observed both above and below the wrinkled SRGO nanoplatelet due to its thinness and electron transparency. Photoluminescence (PL) spectroscopy was then employed to follow the fates of photoexcited charge carriers in these films. Supra-bandgap irradiation of $TiO_2$ results in emission of photons at specific wavelengths associated with either direct bandgap, indirect bandgap (phonon-assisted), or defect mediated recombination in the $TiO_2$ crystal.[31] As shown in FIGS. 2(C) and 2(D), in both the SEG-P25 and SRGO-P25 nanocomposites, increased PL quenching is observed with increased carbon content for the lower energy indirect bandgap and trap level-mediated transitions. In contrast, emission at wavelengths associated with the more rapid direct bandgap transitions, at 345 and 359 nm,[31] were largely preserved.

Figure 3:
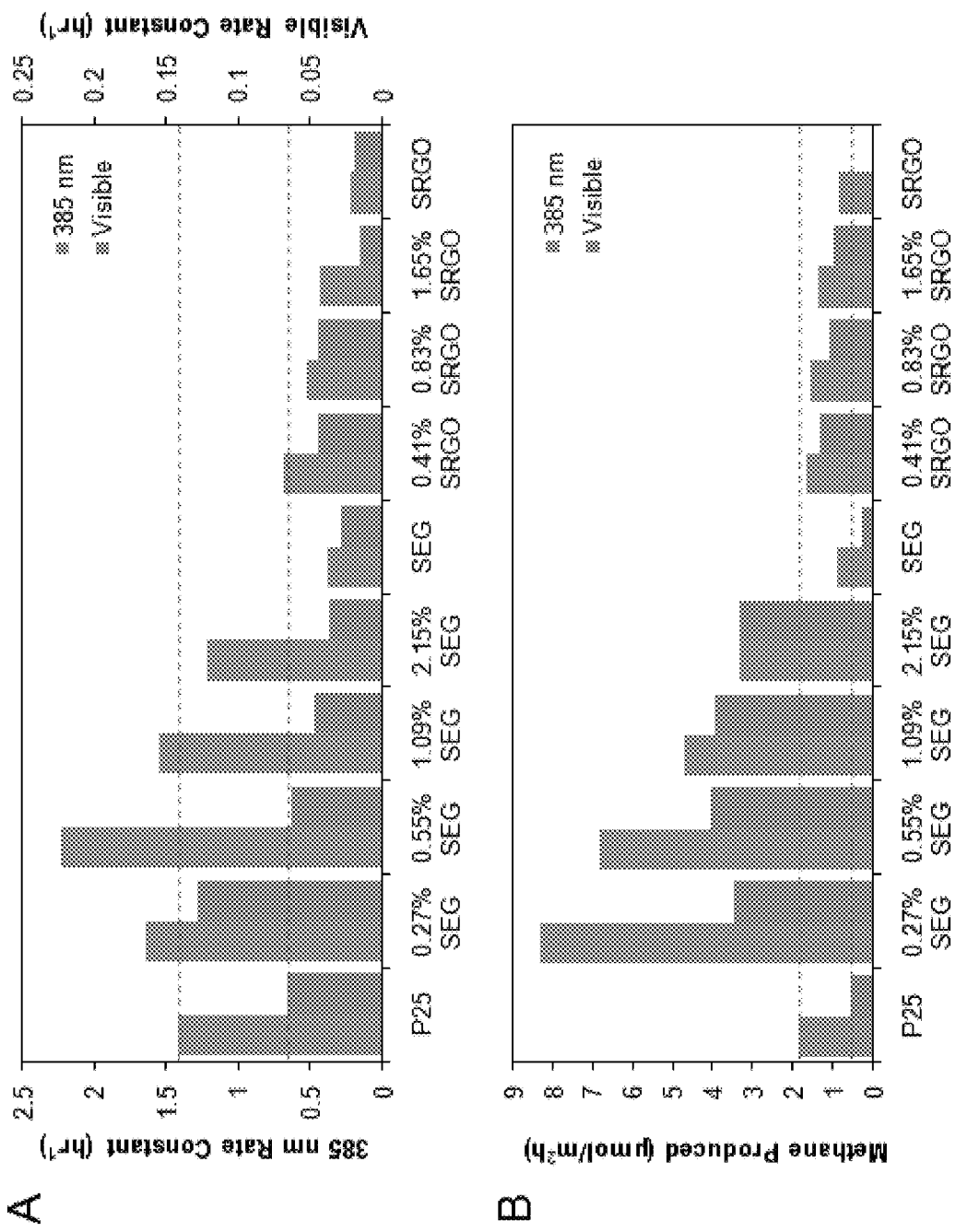
FIG. 3 shows photocatalytic activity of SEG-P25 and SRGO-P25 nanocomposites according to one or more embodiments of the present invention, where (A) shows pseudo first-order $CH_3CHO$ photo-oxidation rate constants for SEG-P25 and SRGO-P25 nanocomposites under ultraviolet (385 nm) and visible illumination; and (B) shows $CO_2$ photo-reduction for SEG-P25 and SRGO-P25 nanocomposites under ultraviolet (385 nm) and visible illumination.

FIG. 3 shows photocatalytic activity of SEG-P25 and SRGO-P25 nanocomposites according to one or more embodiments of the present invention, where (A) shows pseudo first-order $CH_3CHO$ photo-oxidation rate constants for SEG-P25 and SRGO-P25 nanocomposites under ultraviolet (385 nm) and visible illumination; and (B) shows $CO_2$ photo-reduction for SEG-P25 and SRGO-P25 nanocomposites under ultraviolet (385 nm) and visible illumination.

The photocatalytic activity of the SEG and SRGO nanocomposites at various compositions were evaluated via acetaldehyde ($CH_3CHO$) photo-oxidation and $CO_2$ photo-reduction reactions. Pseudo first-order decay rate constants were calculated from $CH_3CHO$ concentration curves following exposure to either ultraviolet (385 nm) or visible radiation. As shown in FIG. 3(A), enhanced $CH_3CHO$ photo-oxidation was observed for SEG-P25 nanocomposites under both irradiation conditions. The largest improvement in the rate of oxidation, 96% greater than P25, was achieved by the 0.27 weight % SEG-P25 nanocomposite under visible illumination. Under ultraviolet irradiation, the 0.55 weight % SEG-P25 film demonstrated the fastest rate of oxidation, which is 57% greater than P25. In contrast, SRGO-P25 films did not exhibit enhanced photo-oxidation under either irradiation condition.

As shown in FIG. 3(B), in the photo-reduction reactions, $CO_2$ was reduced in the presence of water to produce methane ($CH_4$) under the same ultraviolet (385 nm) and visible irradiation conditions. Since $CO_2$ reduction is likely driven by the photoexcited electrons injected into the SRGO or SEG nanoplatelets, this reaction is well-suited for studying the role of graphene and its defects in nanocomposite photocatalysis. The 0.27 weight % SEG-P25 nanocomposite exhibited the highest photo-reductive activity under ultraviolet illumination, producing 4.5 times more $CH_4$ than the P25 film. Under visible illumination, the highest photo-reductive activity was achieved by the 0.55 weight % SEG-P25 nanocomposite, with a 7.2 times enhancement compared to pure P25. Alternatively, no improvement in the photo-reduction activity was observed for SRGO-P25 films under ultraviolet illumination, while a maximum enhancement of 2.3 fold was achieved for the 0.41 weight % SRGO-P25 nanocomposite under visible illumination.

Recent high resolution transmission electron microscopy images have established the atomic-scale structure of RGO resulting from its oxidation-reduction treatment. In this prior work, RGO nanoplatelets were found to be comprised of defect-free graphene regions of 3 to 6 nm in size interspersed by defective domains, consisting of disordered carbon networks, topological defects, ad-atoms, substitutions, and holes, covering about 40% of the surface.[22] In contrast, SEG nanoplatelets exhibit relatively few basal plane defects.[18,32] The defect characteristics for the SRGO and SEG nanoplatelets used in one or more embodiments of the present invention are consistent with these observations as illustrated by the Raman spectra, as shown in FIG. 1(B), that show higher I(D)/I(G) ratios for SRGO compared to SEG. Although defect sites are often more reactive and thus believed to be the drivers of catalytic reactions,[24] this commonly invoked mechanism is apparently not dominant in graphene-$TiO_2$ photocatalysts as evidenced by the larger enhancement factor for the less defective SEG nanocomposites compared to those based on SRGO, as shown in FIG. 3. These differences in defect type and density are also reflected in the electrical properties of SEG and SRGO nanoplatelets. Since basal plane defects increase charge carrier scattering, the electrical conductivity and mobility of individual RGO nanoplatelets have been found to lag behind pristine graphene by 3 and 2 orders of magnitude respectively.[33] Consistent with this previous study, the sheet resistance of our SRGO films exceeds that of our SEG films, as shown in FIG. 1(C).

Another frequently cited mechanism in photocatalysis is the extension of reactive electron and hole lifetimes via charge carrier separation.[7,11] In graphene-P25 photocatalysts, the first step in charge separation is achieved by injection of electrons into the carbon phase, resulting in reduced $TiO_2$ PL. As shown in FIGS. 2(C) and 2(D), a comparable amount of PL quenching was observed for SEG-P25 and SRGO-P25 films at similar compositions, suggesting that electron injection into the carbon phase is similar in these two cases and thus cannot fully explain the observed differences in photocatalytic activity, as shown in FIG. 3.

In addition to serving as a sink for photoexcited electrons, electronic interactions between graphene and $TiO_2$ have been shown to extend the optical absorption of $TiO_2$ to longer wavelengths, which implies enhanced photocatalytic activity under visible illumination.[7,10,11] Since SEG-P25 shows higher photocatalytic activity than SRGO-P25 under visible illumination (as shown in FIG. 3), it appears that SEG has superior electronic coupling to $TiO_2$. In addition, the enhanced electrical mobility of SEG compared to SRGO implies a longer electronic mean free path, which enables energetic electrons to diffuse farther from the graphene-P25 interface, thus decreasing the likelihood of their recombination with holes on the $TiO_2$. In this manner, the lifetime of holes on $TiO_2$ may be prolonged for SEG-P25 nanocomposites, which is consistent with the observed enhancement in photo-oxidation of $CH_3CHO$ by SEG, as shown in FIG. 3(A).

Figure 4:
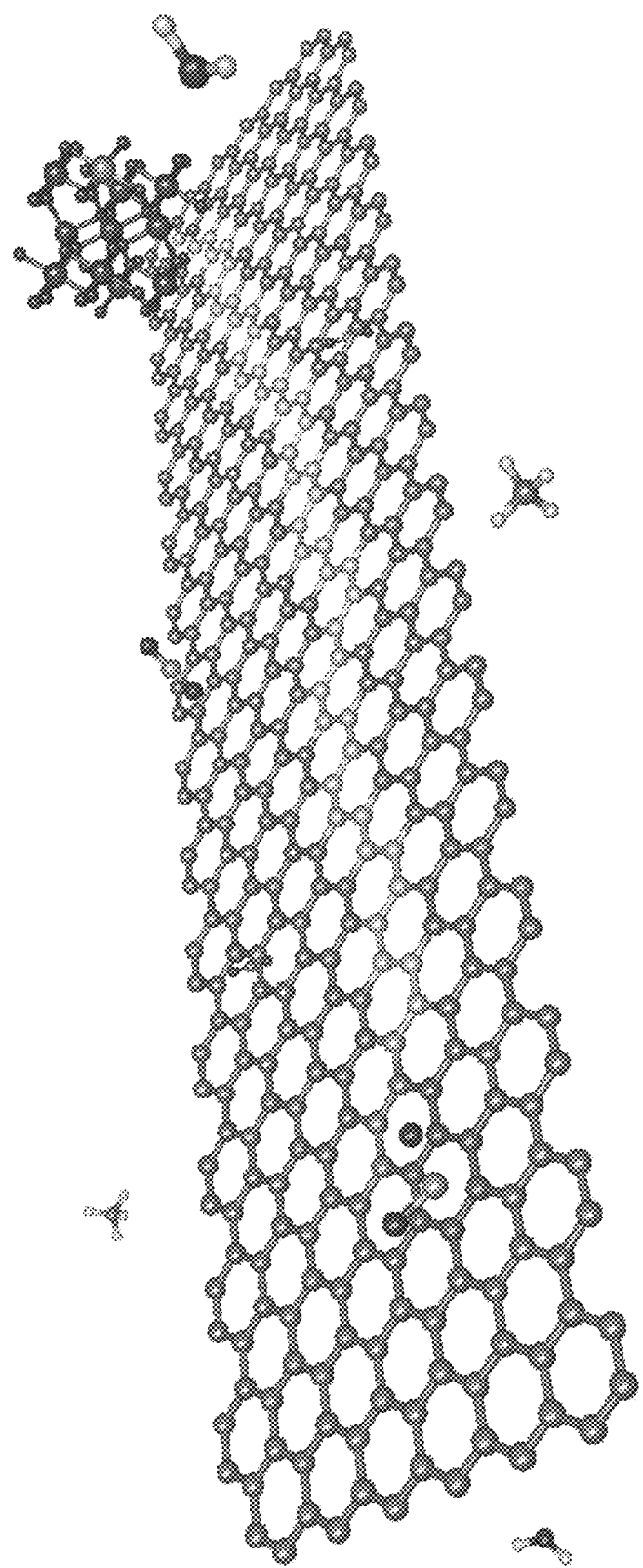
FIG. 4 shows schematically a photocatalytic mechanism for graphene-TiO$_2$ nanocomposites according to one or more embodiments of the present invention.

FIG. 4 shows schematically a photocatalytic mechanism for graphene-$TiO_2$ nanocomposites according to one or more embodiments of the present invention. The color scheme for the atoms is: carbon (gray), hydrogen (white), oxygen (red), and titanium (blue). Upon illumination, the photoexcited electron is injected into the graphene nanoplatelet, leaving behind a $TiO_2$ confined hole (green). Due to its lower density of defects, electrons in SEG are able to diffuse farther (depicted as the yellow pathway), thus sampling a larger surface area for adsorbed $CO_2$.

Since reduction reactions are driven by energetic electrons, they presumably stand to benefit most significantly from the enhanced electrical mobility of SEG. In particular, as shown in FIG. 4, the longer mean free path for electrons on SEG implies that energetic electrons will sample a larger area of the graphene surface, thereby increasing the likelihood of interaction with adsorbed reactants. Consistent with this newly discovered mechanism in one or more embodiments of the present invention, as shown in FIG. 3, the photo-reduction of $CO_2$ was more significantly enhanced than the photo-oxidation of $CH_3CHO$ by SEG. While other factors may also contribute to this observed enhancement (e.g. differences in the adsorption/diffusion of reactants to/through the graphene-P25 films), the strong correlation between electrical mobility of the graphene and photocatalytic activity of the nanocomposite suggests that future efforts to improve carbon-$TiO_2$ photocatalysts may benefit from careful consideration of the electrical properties of the nanocarbon component.

In sum, among other things, the present invention provides a novel approach to synthesize graphene-$TiO_2$ nanocomposite thin films without covalent modification, which allows the production and study of novel graphene-$TiO_2$ photocatalysts with low graphene defect densities. By varying the graphene processing method and nanocomposite loading, the optimized graphene-TiO$_2$ nanocomposites unexpectedly yield approximately two-fold and seven-fold improvements in the photo-oxidation of CH$_3$CHO and photo-reduction of CO$_2$, respectively, compared to pure TiO$_2$ under visible illumination. In contrast to many catalytic systems, the less defective SEG resulted in larger photocatalytic enhancement factors compared to SRGO, especially for the photo-reduction of CO$_2$ to CH$_4$. Following thorough characterization with scanning electron microscopy, optical absorbance and photoluminescence spectroscopy, and charge transport measurements, a direct correlation was found between the electrical mobility of the graphene component and photocatalytic activity. Overall, the present invention provides novel mechanistic insights into nanocomposite-based photocatalysis and is likely to inform ongoing efforts to exploit graphene-based materials in the production of solar fuels.

In another aspect of the disclosure, a method of making non-covalently bonded carbon-based titania nanocomposite thin films includes: forming a carbon-based ink; forming a titania (TiO$_2$) solution; blade-coating a mechanical mixture of the carbon-based ink and the titania solution onto a substrate; and annealing the blade-coated substrate at a first temperature for a first period of time to obtain the carbon-based titania nanocomposite thin films. In certain embodiments, the carbon-based ink may include a concentrated solvent-exfoliated graphene (SEG) ink, or a concentrated single walled carbon nanotube (SWCNT) ink. This aspect relates to the method of making non-covalently bonded SEG-titania or SWCNT-titania nanocomposite thin films with low carbon defect densities. In contrast to existing RGO-based chemistries,[56] the resulting non-covalent coupling between the carbon and titania components preserves the well-defined nanomaterial surface chemistry, allowing for the direct study of interfacial effects on photocatalysis. In particular, SWCNT-TiNS and SEG-TiNS nanocomposites enable the comparison of photo-oxidation and photo-reduction activities for materials with 1D-2D and 2D-2D interfaces, respectively. Under ultraviolet excitation, 2D-2D SEG-TiNS demonstrate superior CO$_2$ photo-reduction activities compared to 1D-2D SWCNT-TiNS, highlighting the stronger optoelectronic coupling between 2D-2D nanomaterials. In contrast, both visible photo-oxidation and visible photo-reduction reactions are enhanced for SWCNT-TiNS, highlighting the effectiveness of 1D SWCNTs as visible TiO$_2$ photosensitizers. While directly relevant to ongoing efforts to improve the performance of nanocomposite photocatalysts, this study also provides fundamental insight into the effects of nanomaterial dimensionality on interfacial charge transport.

Figure 5:
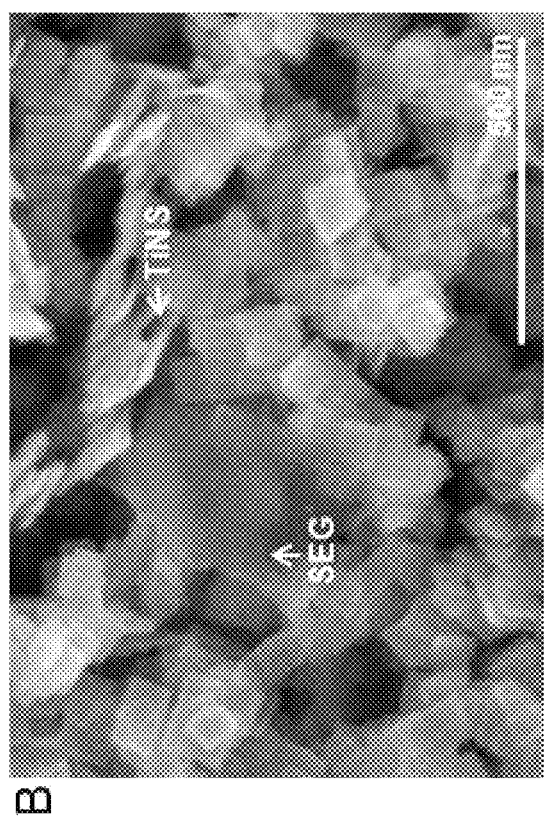
FIG. 5 shows schematically scanning electron micrographs of annealed SWCNT-TiNS and SEG-TiNS nanocomposite thin films, and schematics of the 1D-2D SWCNT-TiNS and (D) 2D-2D SEG-TiNS interfaces according to one or more embodiments of the present invention, where (A) shows a scanning electron micrograph of an annealed 1 weight % SWCNT-TiNS nanocomposite, (B) shows a scanning electron micrograph of an annealed 1 weight % SEG-TiNS nanocomposite thin films, (C) shows the 1D-2D SWCNT-TiNS interfaces, and (D) shows the 2D-2D SEG-TiNS interfaces. The color scheme for the atoms is: carbon (gray), oxygen (red), and titanium (blue).
Figure 5:
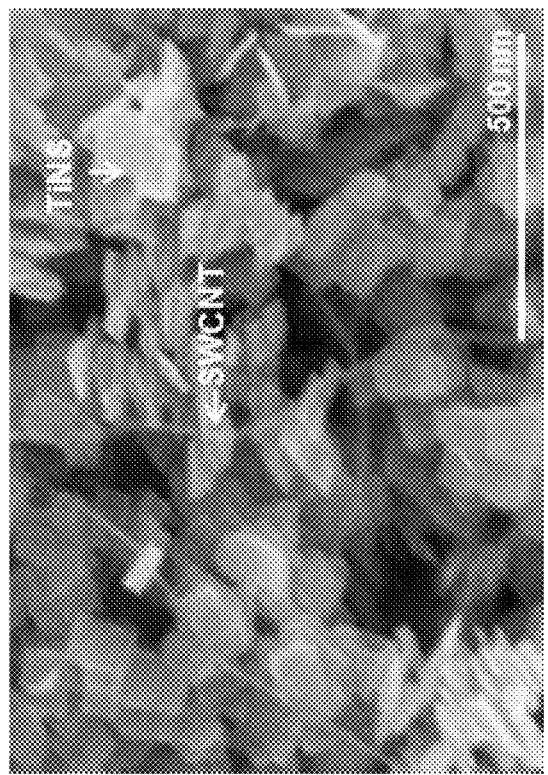
Figure 5:
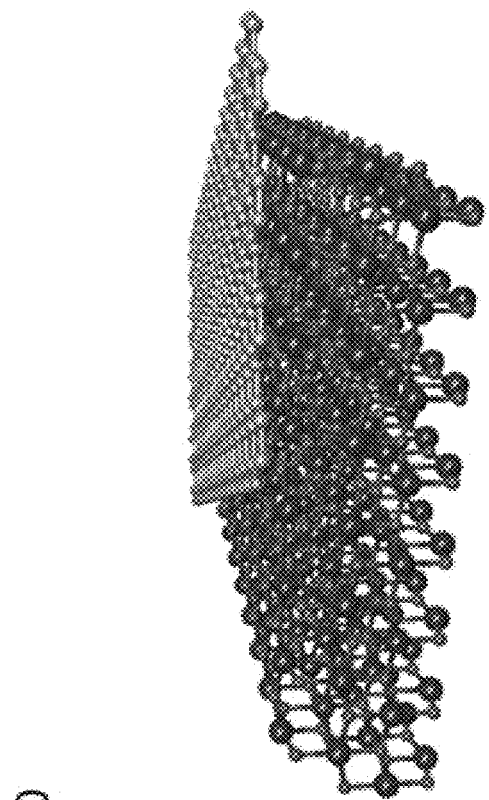
Figure 5:
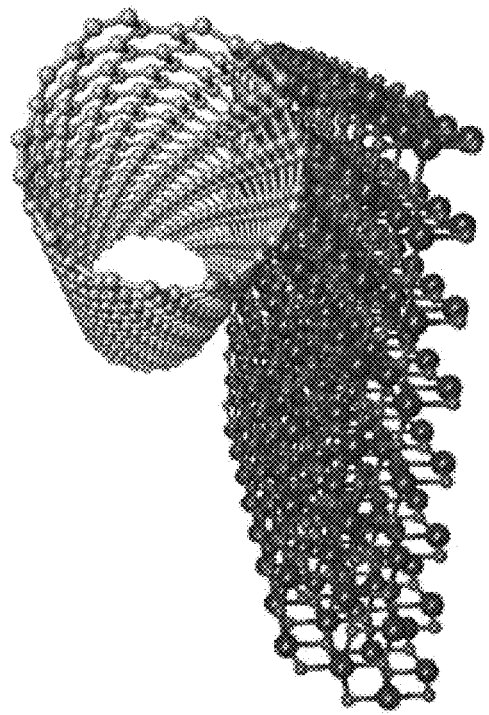

FIG. 5 shows schematically scanning electron micrographs of annealed SWCNT-TiNS and SEG-TiNS nanocomposite thin films, and schematics of the 1D-2D SWCNT-TiNS and (D) 2D-2D SEG-TiNS interfaces according to one or more embodiments of the present invention, where (A) shows a scanning electron micrograph of an annealed 1 weight % SWCNT-TiNS nanocomposite, (B) shows a scanning electron micrograph of an annealed 1 weight % SEG-TiNS nanocomposite thin films, (C) shows the 1D-2D SWCNT-TiNS interfaces, and (D) shows the 2D-2D SEG-TiNS interfaces. The color scheme for the atoms is: carbon (gray), oxygen (red), and titanium (blue).

The SWCNTs used here are 1D, with an average diameter of 1.4 nm and lengths ranging from 0.5 μm to 3 μm. In contrast, SEG is 2D, with an average thickness of approximately 2 nm, as measured by atomic force microscopy (AFM),[34] and lateral dimensions ranging from 50 nm to 750 nm. TiNS are also 2D, with an average thickness of approximately 8 nm and lateral dimensions ranging from 50 nm to 130 nm, with the fraction of (001) TiO$_2$ anatase surface as high as 89%.[42] The SEM of the SWCNT-TiNS and SEG-TiNS nanocomposites reveals their well-dispersed nanoporous structures. As shown in FIG. 5(A), in the SWCNT-TiNS nanocomposite, the 1D SWCNTs are suspended across numerous TiNS. In contrast, as shown in FIG. 5(B), the 2D SEG sheets are stacked against neighboring TiNS in the SEG-TiNS nanocomposite.

Raman spectroscopy was used to quantify the SWCNT and SEG defect density following film formation and annealing. Raman spectra were collected at five different locations for each annealed SWCNT, SEG, and nanocomposite film using a 514 nm laser Typical Raman spectra for SWCNT and SEG contain three primary peaks: the G band at about 1590 cm$^{-1}$, 2D band at about 2700 cm$^{-1}$, and the disorder-associated D band at about 1350 cm$^{-1}$.[67] Of particular interest is the intensity ratio of the D and G bands, I(D)/I(G), which is a measure of the relative concentration of sp$^3$ hybridized defects compared to the sp$^2$ hybridized graphitic domains. The average I(D)/I(G) for the annealed SEG film was 0.17, indicating a relatively low concentration of covalent defects compared to 0.82 for that of covalently modified RGO.[53,57] The average I(D)/I(G) for the annealed SWCNT film was even lower, at 0.02, due to the smaller fraction of edge defects in SWCNTs compared to SEG.

Figure 6:
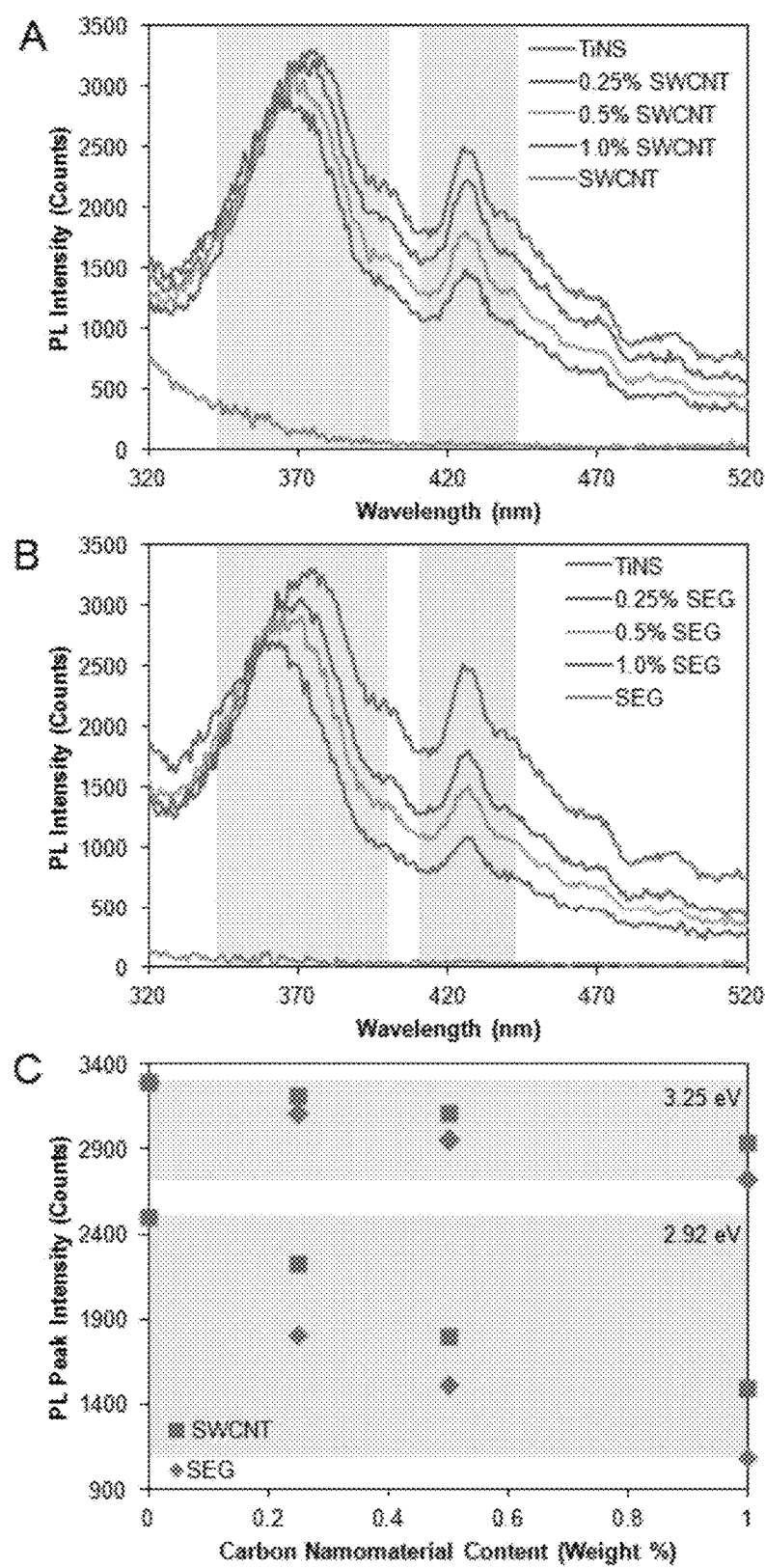
FIG. 6 shows photoluminescence (PL) spectra of SWCNT-TiNS and SEG-TiNS thin films according to one or more embodiments of the present invention, where (A) shows the PL spectra of SWCNT-TiNS thin films, (B) shows PL spectra of SEG-TiNS thin films, and (C) shows peak intensities for the direct and indirect bandgap transitions in SWCNT-based and SEG-based TiNS nanocomposite thin films.

FIG. 6 shows photoluminescence (PL) spectra of SWCNT-TiNS and SEG-TiNS thin films according to one or more embodiments of the present invention, where (A) shows the PL spectra of SWCNT-TiNS thin films, (B) shows PL spectra of SEG-TiNS thin films, and (C) shows peak intensities for the direct and indirect bandgap transitions in SWCNT-based and SEG-based TiNS nanocomposite thin films.

Photoluminescence (PL) spectroscopy provides insight into optoelectronic properties and charge transfer efficiencies across 1D-2D and 2D-2D interfaces. In PL spectroscopy, supra-bandgap illumination of TiNS generates excitons, which can be dissociated for catalysis, non-radiatively recombine, or radiatively recombine. In the case of radiative recombination, emission can occur directly at the anatase TiO$_2$ bandgap at about 380 nm or indirectly through defect and surface-mediated recombination at longer wavelengths.[59] Due to the preferential segregation of energetic electrons onto carbon nanomaterials, SWCNT-TiNS and SEG-TiNS composites exhibit increased PL quenching with increasing carbon content for both direct and indirect transitions, as shown in FIGS. 6(A) and 6(B). However, SEG proved to be more efficient at quenching TiNS PL compared to SWCNTs. For both direct and indirect TiNS transitions, SEG achieves approximately the same level of PL intensity quenching as twice its equivalent mass in SWCNTs, as shown in FIG. 6(C).

Figure 7:
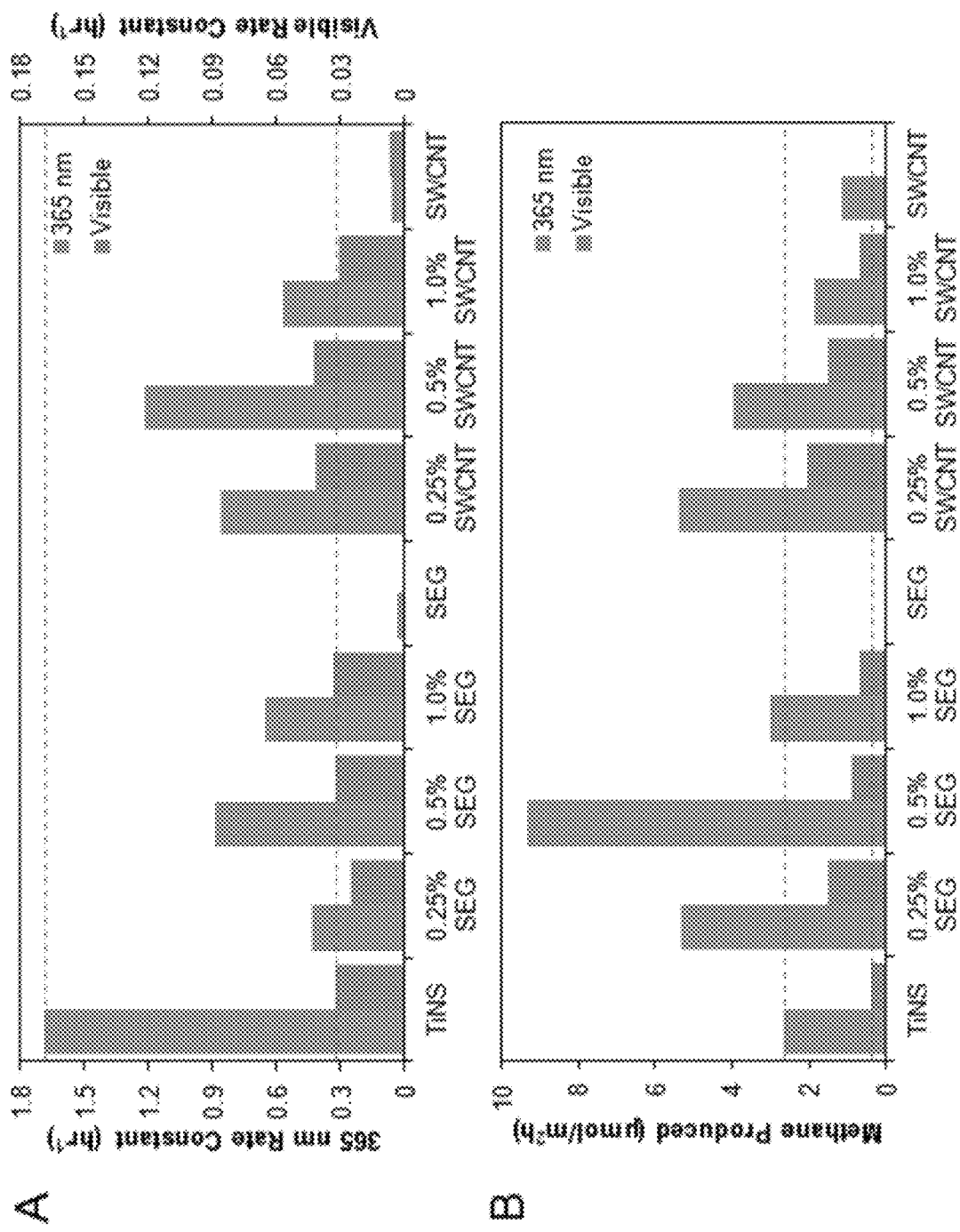
FIG. 7 shows photocatalytic activity of SEG-TiNS and SWCNT-TiNS nanocomposites according to one or more embodiments of the present invention, where (A) shows pseudo first-order rate constants for acetaldehyde ($CH_3COH$) photo-oxidation under ultraviolet (365 nm) and visible irradiation, and (B) shows carbon dioxide ($CO_2$) photo-reduction to $CH_4$ under ultraviolet (365 nm) and visible irradiation.

FIG. 7 shows photocatalytic activity of SEG-TiNS and SWCNT-TiNS nanocomposites according to one or more embodiments of the present invention, where (A) shows pseudo first-order rate constants for acetaldehyde (CH$_3$COH) photo-oxidation under ultraviolet (365 nm) and visible irradiation, and (B) shows carbon dioxide (CO$_2$) photo-reduction to CH$_4$ under ultraviolet (365 nm) and visible irradiation.

SEG-TiNS and SWCNT-TiNS nanocomposites were assessed for their photocatalytic activity in both photo-oxidation and photo-reduction reactions. Pseudo-first-order decay rate constants for acetaldehyde (CH$_3$COH) photo-oxidation were calculated from $CH_3COH$ decay curves under either ultraviolet (365 nm) or visible (>380 nm) irradiation for nanocomposites at various compositions. For SEG-TiNS, improvement was observed for $CH_3COH$ degradation under either irradiation condition compared to pure TiNS, as shown in FIG. 7(A). For SWCNT-TiNS, while no improvement was observed under ultraviolet irradiation, a maximum improvement of 31% in the $CH_3COH$ decay rate constant was observed for the 0.5% SWCNT-TiNS film under visible irradiation, as shown in FIG. 7(A).

In carbon dioxide ($CO_2$) photo-reduction, methane ($CH_4$) is produced from a water saturated $CO_2$ atmosphere under either ultraviolet (365 nm) or visible (>380 nm) irradiation. The amount of $CH_4$ is measured using gas chromatographic separation and flame ionization detection (GC/FID) both prior to and after 3 hours of illumination to determine the photo-reduction activity for each film. In contrast to $CH_3COH$ photo-oxidation, marked improvements in $CO_2$ photo-reduction were observed for both SWCNT-TiNS and SEG-TiNS films. As shown in FIG. 7(B), under ultraviolet illumination, maximum improvement factors of 2 and 3.5 were achieved for the 0.25% SWCNT-TiNS and 0.5% SEG-TiNS films, respectively, in comparison to pure TiNS. Under visible illumination, maximum improvement factors of 5.1 and 3.7 were achieved for the 0.25% SWCNT-TiNS and SEG-TiNS films, respectively, in comparison to pure TiNS, as shown in FIG. 7(B).

In contrast to recent work which showed covalently bound $SWCNT-TiO_2$ and $RGO-TiO_2$ nanocomposites to be similarly photoactive,[59] major differences were observed between the catalytic performance of SWCNT-TiNS and SEG-TiNS thin films. These photocatalytic differences can be attributed to the unique structure and optoelectronic properties of these 1D and 2D nanomaterials. In composite form, 2D SEG shows more intimate electronic and physical coupling with 2D TiNS in comparison to 1D SWCNT, as shown in FIGS. 5-6. With this conformal 2D-2D interface, SEG can more effectively dissociate and inhibit the recombination of TiNS photogenerated excitons compared to SWCNTs, resulting in superior TiNS PL quenching. Since reduction reactions utilize the energetic electrons segregated to the nanocarbon surface,[53,54,66] $CO_2$ photo-reduction on SEG-TiNS is more significantly enhanced than SWCNT-TiNS. In particular, the most photoactive SEG-TiNS film produced 73.5% more $CH_4$ than the most photoactive SWCNT-TiNS film under ultraviolet irradiation, as shown in FIG. 7B.

Other factors that may contribute to the observed enhancements include an increase in the overall effective surface area and the porosity difference between SWCNT-TiNS and SEG-TiNS thin films. However, since the continued increase in surface area provided by SWCNT and SEG past 0.5 weight % resulted in decreasing photoactivities (as shown in FIG. 7), the former is unlikely to be a dominant factor. Moreover, any porosity difference between SWCNT-TiNS and SEG-TiNS thin films is unlikely to explain the large discrepancy between their photocatalytic performance since the pore structure of the most photoactive, low carbon compositions remain dominated by the TiNS network, as shown in FIGS. 5(A) and 5(B).

Unlike $CO_2$ photo-reduction, $CH_3COH$ photo-oxidation utilizes the holes on the TiNS surface. In nanocomposite films, photo-oxidation reactions also benefit from extended reactive hole lifetimes and diminished electron/hole recombination that result from electron segregation onto the carbon nanomaterials. However, as shown in FIG. 7, no enhancement in $CH_3COH$ oxidation was observed for either SWCNT-TiNS or SEG-TiNS films under ultraviolet illumination. In particular, SEG-TiNS films were less active than SWCNT-TiNS films despite the improved propensity of SEG to separate electrons from the holes on TiNS. Consequently, the decreased activity of the SEG-TiNS films is likely due to the greater loss of accessible TiNS oxidative surface area in the more intimately coupled 2D-2D SEG-TiNS composites compared to the 1D-2D SWCNT-TiNS composites. The net result is that, for both sets of films, any gains from nanocomposite charge carrier separation were offset by the loss of accessible TiNS surface area, yielding a net loss in ultraviolet photo-oxidation activity.

Since anatase $TiO_2$ has a bandgap of about 3.25 eV,[69] stand-alone TiNS displayed very low photoactivity under the visible irradiation conditions of these experiments. This minor visible response can be attributed to the presence of vacancy and surface defects as well as fluorine-doping from the TiNS synthesis.[69,70] These defects result in the formation of intra-bandgap transition states, which are reflected in the TiNS PL spectra, as shown in FIG. 6. In composites, $TiO_2$ visible photoactivity can be enhanced by either nanocarbon surface doping or photosensitization.[54] The evaluation of these effects in composite photocatalysis requires a more detailed understanding of the electronic structures of 1D and 2D carbon nanomaterials. In particular, 2D graphene is a zero bandgap semiconductor, while 1D SWCNTs can be either semiconducting or metallic depending on their chiral vector. As-synthesized SWCNT populations, such as those used in this work, are typically one-third metallic and two-thirds semiconducting at room temperature.[71] Therefore, for composite photocatalysis, SWCNTs can provide enhanced $TiO_2$ photosensitization due to their increased optical absorption in the visible and infrared regions, resulting from 1D van Hove singularities, and longer semiconductor exciton lifetimes, compared to graphene and metallic SWCNTs.[71,72]

Accordingly, SWCNT-TiNS films demonstrated higher visible photocatalytic activities in both reduction and oxidation reactions (as shown in FIG. 7). These results suggest that, for non-covalently bound nanocarbon-TiNS films, photosensitization, where reactive charge carriers are generated in the carbon nanomaterial and then transferred to TiNS, is the primary enhancement mechanism for visible photocatalysis. Otherwise, TiNS nanocomposites based on the more intimately coupled SEG would have yielded higher photoactivities through stronger surface doping. The superior performance of these non-covalently bound SWCNT-TiNS composites under visible illumination contrasts with recent work on covalently bound nanocarbon-$TiO_2$ composites in which no discernible difference was observed between $SWCNT-TiO_2$ and graphene-$TiO_2$ photoactivities.[59] This disparity suggests that covalent modification in composite photocatalysts results in both enhanced carbon $TiO_2$ surface doping and suppressed carbon $TiO_2$ photosensitization by disrupting the pristine SWCNT electronic structure.[57,73]

In sum, among other things, the present invention provides a novel approach to synthesize non-covalently bonded SWCNT-TiNS and SEG-TiNS nanocomposites with low carbon defect densities, leading to improved insight into nanocomposite photocatalytic enhancement mechanisms. Due to the 1D and 2D nature of these materials, SEG was shown to provide a more intimate optoelectronic coupling with TiNS in comparison to SWCNT, resulting in considerably higher PL quenching and ultraviolet photo-reduction activities for SEG-TiNS films. Alternatively, SWCNT-TiNS films yielded higher visible photo-oxidation and visible photo-reduction activities due to the ability of SWCNTs to sensitize TiNS to longer wavelength light. Overall, this work is likely to inform ongoing efforts to realize well-defined nanocomposite interfaces and exploit the unique optoelectronic properties of low-dimensional carbon nanomaterials in photochemical devices.

These and other aspects of the present invention are further described below.

Implementations and Examples of the Invention

Without intent to limit the scope of the invention, exemplary instruments, apparatus, methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example One

1. Graphene Synthesis and Characterization
1.1 Solvent Exfoliated Graphene (SEG) Synthesis In this example, 2.5 g of natural graphite (Asbury Carbon, 3061) was added to 50 ml of N,N-dimethylformamide (DMF, Mallinckrodt Analytical) and sonicated in a Bransonic 3510 tabletop ultrasonic cleaner for 3 hours at 40 kHz and 100 W. These solutions were then combined into 250 ml centrifuge tubes and sedimented in a large volume centrifuge (Beckman Coulter Avanti J-26 XP Centrifuge) for 4.5 hours at 7500 rpm, or an average relative centrifugal force of 6804 g. The graphene concentration of this SEG solution, 0.013 mg/ml, was determined by measuring the difference in filter (Whatman Anodisc, 0.02 µm pore size) masses after filtering both 20 and 50 ml of the solution.

1.2 Graphene Oxide (GO) Synthesis

As a comparative example, GO was produced using a modified version of Hummers method. 5 g of natural graphite (Asbury Carbon, 3061) were added to 115 ml of concentrated sulfuric acid ($H_2SO_4$) and cooled to 0° C. 15 g of potassium permanganate ($KMnO_4$, Aldrich) were then gradually added to the solution in an ice bath. The temperature of the mixture was then raised to 35° C. and stirred for 2 hours. 230 ml of deionized water (DI-$H_2O$) were slowly added to the solution while stirring. After 15 minutes, an additional 700 ml of DI-$H_2O$ were added to terminate the oxidation reaction. Finally, 12.5 ml of 30% hydrogen peroxide ($H_2O_2$) were added, producing a bright yellow solution of oxidized graphene and graphite. A combination of filtration and centrifugation was subsequently employed to remove the graphite, metallic ions, and excess acid. The solution was passed through a filter (Whatman Anodisc, 0.2 µm pore size) and rinsed with 1.5 L of 10% hydrochloric acid (HCl)-DI $H_2O$. The filtrate was then resuspended in 500 ml of DI-$H_2O$ and centrifuged for 1 hour at 7500 rpm to remove the unoxidized graphite. The GO containing supernatant was then collected via sedimentation at 7500 rpm for 16 hours after which the pellet was redispersed in DI-$H_2O$ after 30 min of sonication. The sedimentation and sonication procedure was repeated three more times to yield a GO solution with about 6 pH. A final GO sedimentation step was then performed, and the GO nanoplatelets were redispersed in DMF.

1.3 Solvothermal Reduction of GO

Thermal reduction of GO was performed in DMF. A solution of 0.015 mg/ml GO-DMF was refluxed for 5 hours while stirring, yielding highly reduced GO precipitates in DMF. A homogenous solvent reduced graphene oxide (SRGO) solution was then produced following 90 minutes of sonication. The graphene concentration of this SRGO solution was determined by measuring the difference in filter masses after filtering both 17 ml and 50 ml of this solution.

1.4 Optical Characterization of SEG and SRGO Nanoplatelets

Figure 8:
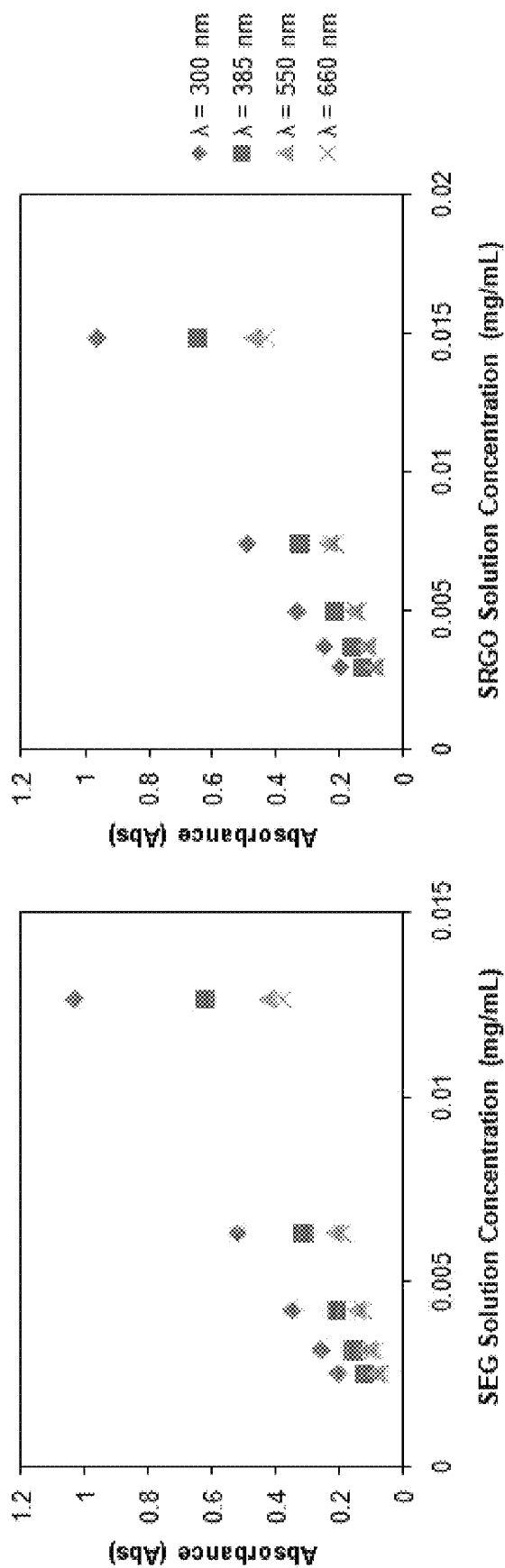
FIG. 8 shows the optical absorbance of SEG (left) and SRGO (right) nanoplatelets in DFM at five different concentrations according to one or more embodiments of the present invention.

FIG. 8 shows the optical absorbance of SEG (left) and SRGO (right) nanoplatelets in DFM at five different concentrations according to one or more embodiments of the present invention.

Optical absorbance spectra of both SEG-DMF and SRGO-DMF solutions were collected using a Varian Cary 5000 spectrophotometer. Five different SEG and SRGO solutions ranging from 2.5 to 15 µg/ml were used to determine the absorbance coefficient of SEG and SRGO nanoplatelets in DMF. As shown in FIG. 8, the SEG and SRGO absorbance within each set of solutions was found to be highly linear within this range of concentration with standard deviations of their absorbance coefficients at less than 1%. The average absorbance coefficients between 300 and 1300 nm are shown in FIG. 1(D).

1.5 Electronic Characterization of SEG and SRGO Nanoplatelets

Thin films of SEG and SRGO were formed via vacuum filtration of different stock solution volumes through 25 mm diameter alumina filters (Whatman Anodisc, 0.02 µm pore size). Their sheet resistances were measured using four-point probe measurements with the probes arranged in a linear configuration and 1 mm spacing, as shown in FIG. 1(C). A GO film with an areal density of 32 µg/mL was also measured, yielding a sheet resistance of 4.38 GΩ/sq. The SRGO film at the same density showed over five orders of magnitude decrease in sheet resistance at 18.1 kΩ/sq.

1.6 Atomic Force Microscopy (AFM) Characterization of SEG and SRGO Nanoplatelets Graphene nanoplatelets from both the SEG ink and SRGO solution were deposited onto 100 nm thick oxide silicon wafers for AFM imaging. The wafers were first submerged in 2.5 mM 3-aminopropyl triethoxysilane (ATPES) aqueous solution to functionalize the surface with a hydrophobic self-assembled monolayer for 30 minutes. The substrates were then rinsed with DI-$H_2O$ and dried under a stream of nitrogen. The graphene solutions were then diluted to approximately 0.02 mg/ml in ethanol after which drops of each were placed onto the wafers for 10 minutes. The drops were then blown off under a stream of $N_2$, and the wafers were rinsed with DI-$H_2O$. The SEG wafers were subsequently annealed for 30 minutes at 400° C. in air to remove solution residues.

Figure 9:
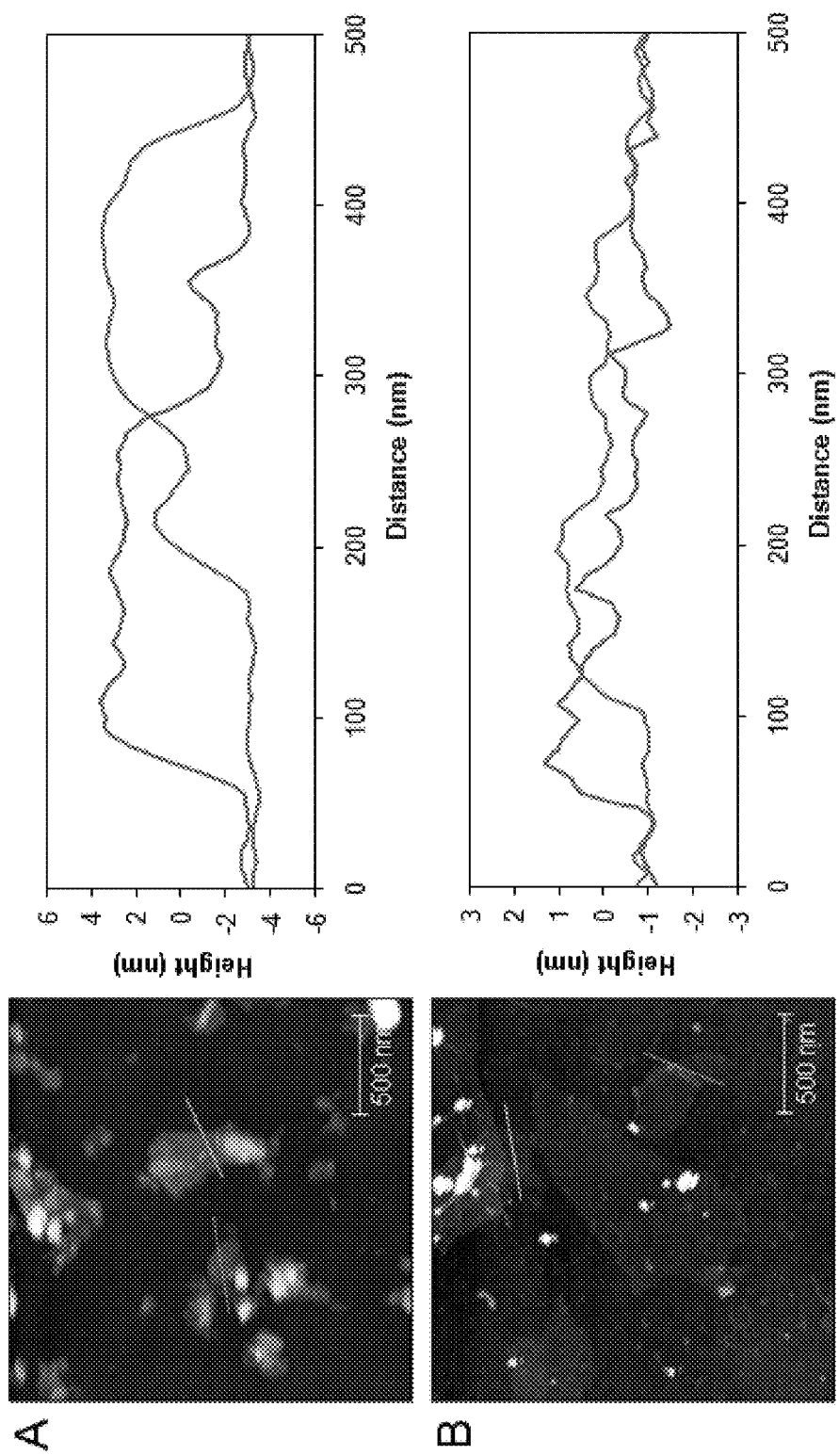
FIG. 9 shows AFM images and line scans of SEG and SRGO nanoplatelets according to one or more embodiments of the present invention, where (A) shows an AFM image and two line scans of SEG nanoplatelets deposited from a diluted SEG ink after annealing at 400° C. for 30 min in air; and (B) shows an AFM image and two line scans of SRGO nanoplatelets deposited from a diluted DMF.

FIG. 9 shows AFM images and line scans of SEG and SRGO nanoplatelets according to one or more embodiments of the present invention, where (A) shows an AFM image and two line scans of SEG nanoplatelets deposited from a diluted SEG ink after annealing at 400° C. for 30 min in air; and (B) shows an AFM image and two line scans of SRGO nanoplatelets deposited from a diluted DMF.

All AFM images as shown in FIG. 9 were obtained with a Thermo Microscopes Autoprobe CP-Research AFM in tapping mode using cantilever B on MikroMasch NSC36/Cr—AuBS probes. As shown in FIG. 9, these 2 µm×2 µm images were collected using identical scanning parameters, and two line scan nanoplatelet profiles are plotted from each image. As expected, SEG dispersions were composed of predominately few-layer graphene nanoplatelets with lateral dimensions ranging from about 50 nm to 750 nm. SRGO dispersions were comprised of thin graphene nanoplatelets with greater lateral extent, ranging from about 500 nm to several microns.

1.7 Raman Spectra of SEG and SRGO Nanoplatelets

Figure 10:
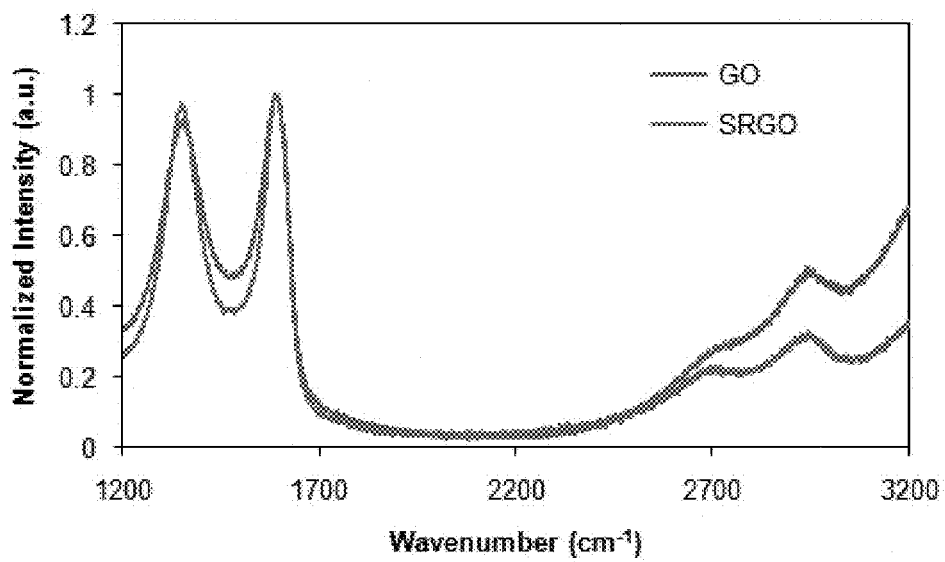
FIG. 10 shows Raman spectra obtained for filtered GO and SRGO nanoplatelets before and after thermal reduction in DMF according to one or more embodiments of the present invention.

FIG. 10 shows Raman spectra obtained for filtered GO and SRGO nanoplatelets before and after thermal reduction in DMF according to one or more embodiments of the present invention.

The Raman spectra as shown in FIG. 10 were obtained for GO and SRGO nanoplatelets on alumina filters as well as SEG and SRGO nanoplatelets deposited from ethyl-cellulose (EC) stabilized inks after annealing at 400° C. for 30 minutes in air using a Renishaw inVia Raman microscope with an excitation wavelength of 514 nm. Five spectra were obtained on different areas of each film and combined to form a representative Raman spectrum for the entire film. Consistent with previous GO reduction studies, the intensity ratio of the D and G bands, I(D)/I(G), for the GO before and after thermal reduction remained relatively unchanged, as shown in FIG. 10.[15, 33]

Figure 11:
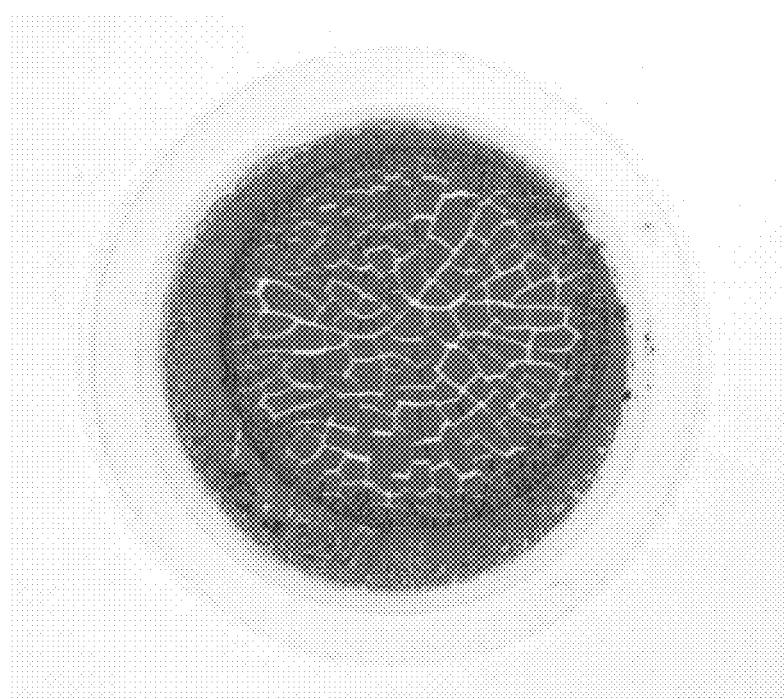
FIG. 11 shows a photograph of a vacuum filtered 1% SEG-P25 composite exhibiting macroscopic fissure after drying on a 25 mm diameter alumina membrane according to one or more embodiments of the present invention.

2. SEG-P25 and SRGO-P25 Characterization 2.1 Vacuum Co-Filtration of SEG and P25 $TiO_2$ FIG. 11 shows a photograph of a vacuum filtered 1% SEG-P25 composite exhibiting macroscopic fissure after drying on a 25 mm diameter alumina membrane according to one or more embodiments of the present invention.

Vacuum filtration was explored as a possible synthetic method for producing SEG-P25 and SRGO-P25 composites. Individual dispersions of SEG and P25 $TiO_2$ were combined and filtered on an alumina membrane (Whatman Anodisc, 0.02 µm pore size) to form a 1% SEG-P25 composite film. However, upon drying, the nanocomposite exhibited macroscopic cracks, rendering these films unsuitable for photocatalytic measurements that require controlled light exposure, as shown in FIG. 11.

2.2 SEG-P25 and SRGO-P25 Nanocomposite Films

Figure 12:
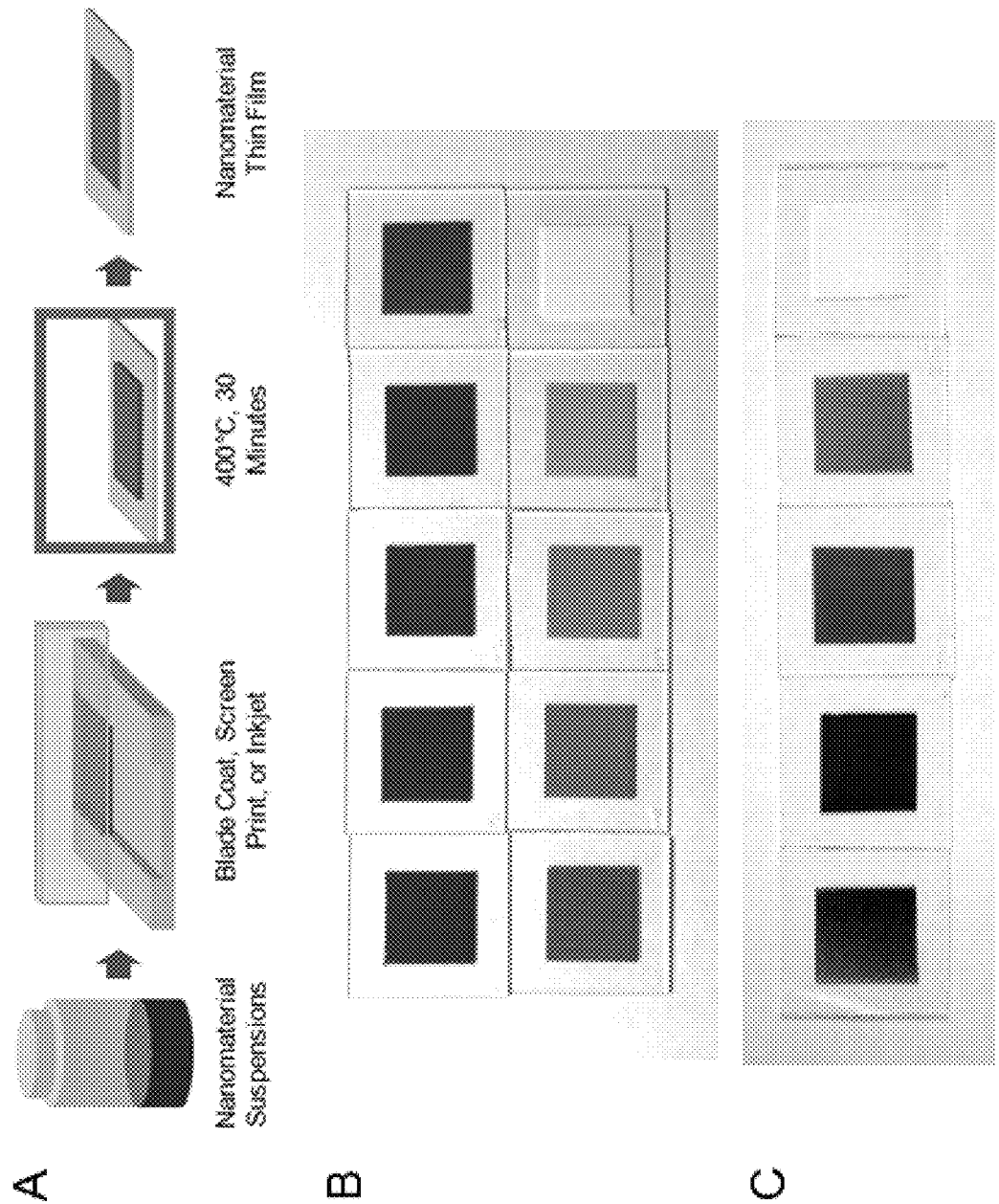
FIG. 12 shows schematically the method of forming graphene-based nanocomposite thin films and the thin films formed according to one or more embodiments of the present invention, where (A) shows the method of forming graphene-based nanocomposite thin films according to one embodiment; (B) shows a series of SEG-P25 nanocomposite thin films ranging from 0.27 weight % to 26 weight % SEG deposited on 2.54 cm×2.54 cm glass slides; and (C) shows an analogous series of SRGO-P25 thin films ranging from 0.41 weight % to 1.65 weight % SEG.

FIG. 12 shows schematically the method of forming graphene-based nanocomposite thin films and the thin films formed according to one or more embodiments of the present invention, where (A) shows the method of forming graphene-based nanocomposite thin films according to one embodiment; (B) shows a series of SEG-P25 nanocomposite thin films ranging from 0.27 weight % to 26 weight % SEG deposited on 2.54 cm×2.54 cm glass slides; and (C) shows an analogous series of SRGO-P25 thin films ranging from 0.41 weight % to 1.65 weight % SEG.

To circumvent the limitations of vacuum filtration, a general approach was developed to deposit graphene nanocomposites using a film-forming polymer. Due to its graphene stabilizing and film forming capabilities,[13] graphene dispersions were concentrated into 2 g of 10% w/v EC-terpineol solution to form SEG and SRGO inks after evaporating DMF at reduced pressures. A separate Degussa P25 $TiO_2$ ink was produced following a previously established protocol for producing highly porous $TiO_2$ electrodes for dye-sensitized solar cells.[30] After blade coating and annealing, as shown in FIG. 12, mechanical mixtures of these inks produced homogenous nanocomposite thin films. The compositions of these nanocomposite films were tuned by varying the fraction of graphene and P25 inks in the mechanical mixture.

Film thicknesses and optical extinction were measured prior to the photocatalytic assessment of the SEG-P25 and SRGO-P25 nanocomposite films. Profilometry was performed using a Veeco Dektak 150 Surface Profilometer with a 2.5 µm tip radius. Optical extinction was measured using a Varian Cary 5000 spectrophotometer, with the background from the glass slide subtracted from the measurements. The thickness and extinction values at both 385 nm and 550 nm for each film are summarized in Table 1. The thickness and optical extinction at both ultraviolet ($\lambda$=385 nm) and visible ($\lambda$=550 nm) wavelengths for each photocatalytic thin film tested.

TABLE 1 thickness and extinction values at both 385 nm and 550 nm for each film

| Film | Thickness (µm) | Extinction at 385 nm (Abs) | Extinction at 550 nm (Abs) |
| --- | --- | --- | --- |
| P25 | 7.6 | 3.13 | 1.04 |
| 0.27% SEG | 8.5 | 3.08 | 0.81 |
| 0.55% SEG | 7.2 | 3.63 | 1.04 |
| 1.09% SEG | 7.7 | 3.81 | 1.17 |
| 2.15% SEG | 6.45 | 3.77 | 1.48 |
| SEG | 0.3 | 1.8 | 1.26 |
| 0.41% SRGO | 12.1 | 3.68 | 1.77 |
| 0.83% SRGO | 11.6 | 4.45 | 2.47 |
| 1.65% SRGO | 9.5 | 5.83 | 3.61 |
| SRGO | 0.4 | 1.47 | 1.03 |

2.3 Raman Characterization of SEG-P25 and SRGO-P25 Nanocomposites

Figure 13:
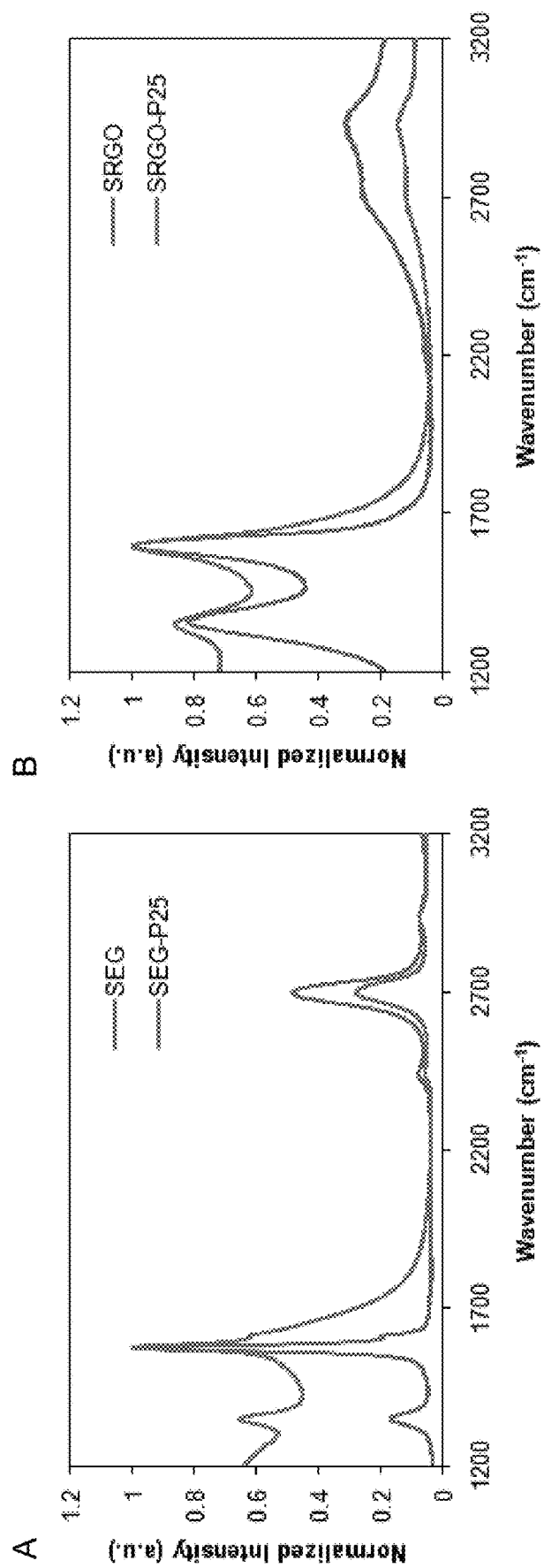
FIG. 13 shows combined Raman spectra of annealed SEG, SEG-P25, SRGO and SRGO-P25 films according to one or more embodiments of the present invention, where (A) shows Raman spectra of annealed SEG and 1.09 weight % SEG-P25 films, and (B) shows Raman spectra of annealed SRGO and 1.65 weight % SRGO-P25 films.

FIG. 13 shows combined Raman spectra of annealed SEG, SEG-P25, SRGO and SRGO-P25 films according to one or more embodiments of the present invention, where (A) shows Raman spectra of annealed SEG and 1.09 weight % SEG-P25 films, and (B) shows Raman spectra of annealed SRGO and 1.65 weight % SRGO-P25 films. As shown in FIG. 13, Raman spectroscopy was also performed on annealed SEG, SRGO, SEG-P25, and SRGO-P25 films. These Raman spectra for the annealed SEG and SEG-P25 clearly exhibit three primary peaks: the disorder-associated D bands at about 1350 $cm^{-1}$, the G band at about 1590 $cm^{-1}$, and the 2D band at about 2700 $cm^{-1}$, respectively. It is shown that for the annealed SEG film, a ratio of the peak intensity at the D-band to the peak intensity at the G-band of the Raman spectrum is about 0.17. Further, the SEG-$TiO_2$ nanocomposite thin film, the ratio of the peak intensity at the D-band to the peak intensity at the G-band of the Raman spectrum is less than 1. The low intensity ratio between the D and G bands for these annealed films indicate that few defects were introduced through nanocomposite formation. These spectra also showed minimal variation across the different film locations and were combined to form a representative Raman spectrum for the entire film. The P25 $TiO_2$ contributes to the broad peak observed between 1200 $cm^{-1}$ and 2000 $cm^{-1}$ in the composite films.

2.4 Photoluminescence (PL) Spectra of SEG-P25 and SRGO-P25 Nanocomposites

PL spectra of nanocomposite films were collected using a commercial photon counting ISS PC-1 Fluorimeter. All measurements were made using a 295 nm excitation wavelength with the film oriented 22.5° orthogonal to the incident light path towards the photon counting detector in a nitrogen atmosphere. 2 mm excitation slits, 1 mm emission slits, and cross-polarizers were used to obtain optimal signal intensity and minimal Raleigh scattering.

Figure 14:
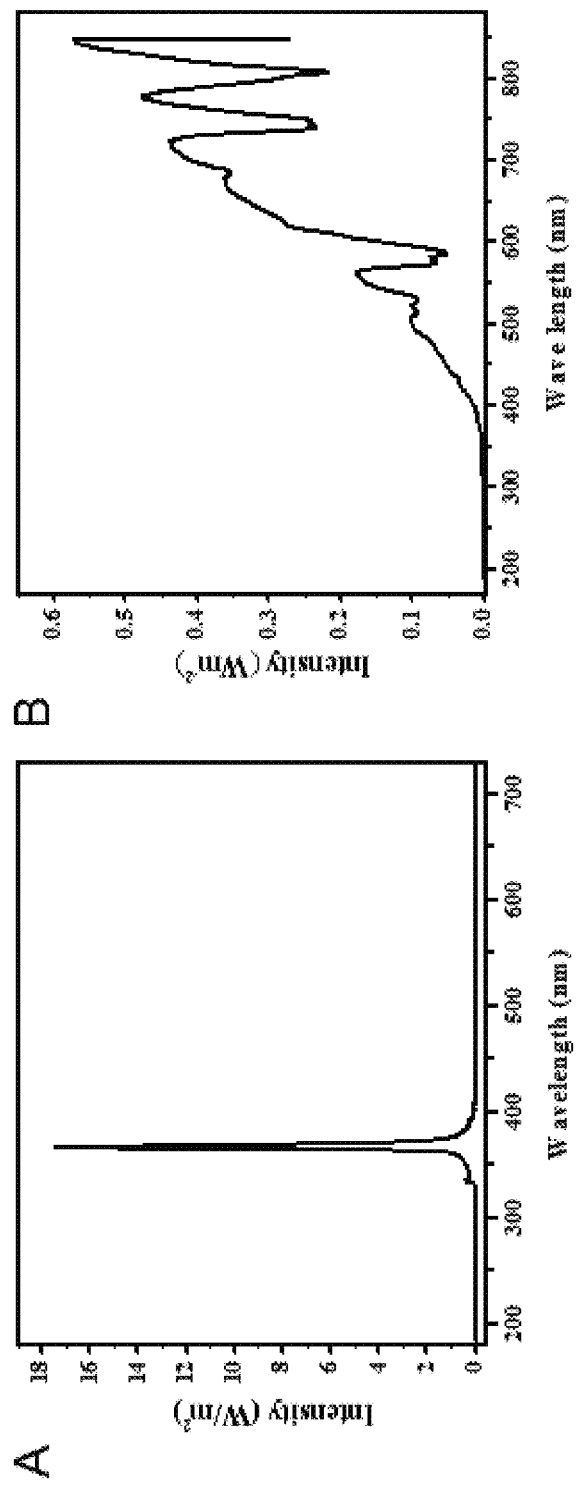
FIG. 14 shows emission spectra of light sources used in photocatalytic testing according to one or more embodiments of the present invention, where (A) shows an emission spectrum of the mercury vapor lamp used in photocatalytic testing; and (B) shows an emission spectrum of the natural daylight bulb used in photocatalytic testing.

3. SEG-P25 and SRGO-P25 Photocatalytic Measurements
3.1 Photocatalytic Testing of SEG-P25 and SRGO-P25 Films FIG. 14 shows emission spectra of light sources used in photocatalytic testing according to one or more embodiments of the present invention, where (A) shows an emission spectrum of the mercury vapor lamp used in photocatalytic testing; and (B) shows an emission spectrum of the natural daylight bulb used in photocatalytic testing.

Photocatalytic reactions were carried out using either UV light from a mercury vapor lamp (100 W), with a wavelength of 365 nm and an energy density of about 110 W/m$^2$, or a natural daylight bulb (60 W, Halco Lighting, Pure Lite, Neodymium), with wavelengths ranging from about 400 to 850 nm and energy density of about 31 W/m$^2$. The emission spectra of both light sources are shown in FIG. 11.

Figure 15:
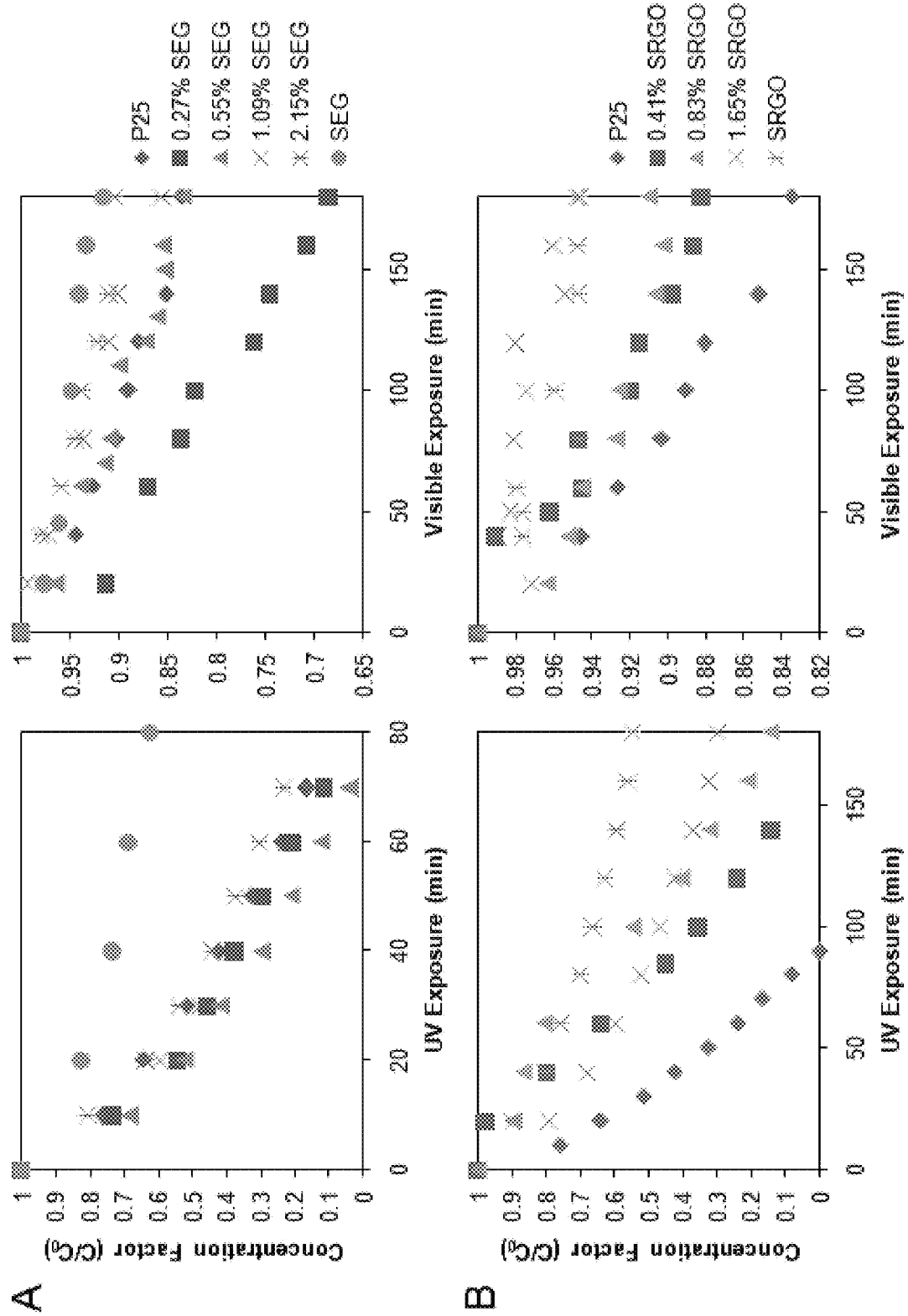
FIG. 15 shows $CH_3CHO$ photo-oxidation on SEG-P25 and SRGO-P25 thin films under UV and visible exposures according to one or more embodiments of the present invention, where (A) shows $CH_3CHO$ photo-oxidation on SEG-P25 thin films at different compositions under UV exposure (left) and visible exposure (right); and (B) shows $CH_3CHO$ photo-oxidation on SRGO-P25 thin films at different compositions under UV exposure (left) and visible exposure (right).

FIG. 15 shows $CH_3CHO$ photo-oxidation on SEG-P25 and SRGO-P25 thin films under UV and visible exposures according to one or more embodiments of the present invention, where (A) shows $CH_3CHO$ photo-oxidation on SEG-P25 thin films at different compositions under UV exposure (left) and visible exposure (right); and (B) shows $CH_3CHO$ photo-oxidation on SRGO-P25 thin films at different compositions under UV exposure (left) and visible exposure (right).

Photo-oxidation reactions were performed in a 25 ml Teflon chamber with a quartz window 1 h after injecting 0.5 ml of acetaldehyde ($CH_3CHO$) vapor in the dark at room temperature. As shown in FIG. 15, a Hewlett Packard 5890 gas chromatograph equipped with a flame ionizing detector was used to monitor the $CH_3CHO$ concentrations.

Figure 16:
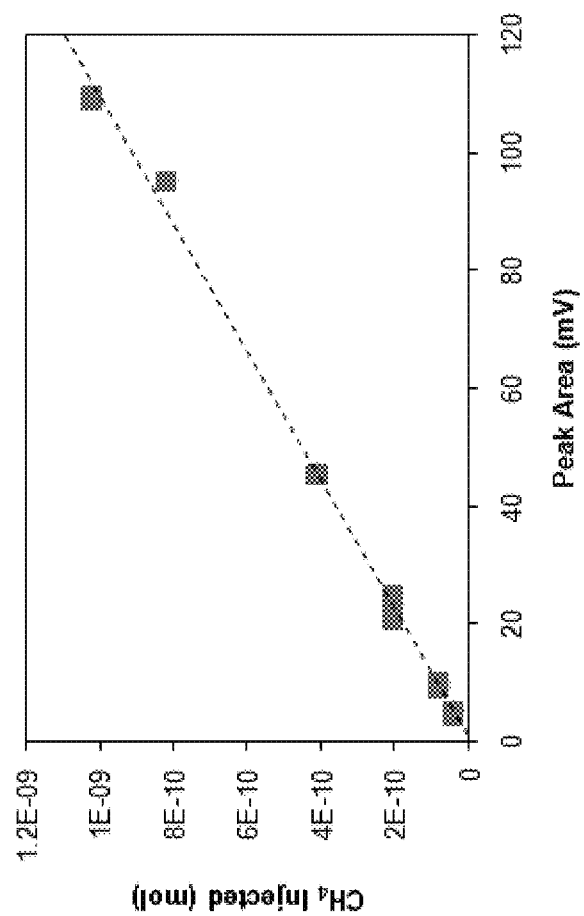
FIG. 16 shows the standard curve for the gas chromatograph used to determine $CH_4$ concentration within the reactor according to one embodiment of the present invention.

FIG. 16 shows the standard curve for the gas chromatograph used to determine $CH_4$ concentration within the reactor according to one embodiment of the present invention. In the photo-reduction of carbon dioxide ($CO_2$) to methane ($CH_4$), a 25 ml Teflon chamber was first purged with $H_2O$-saturated $CO_2$ (99.99%) at ambient temperatures for 1 hour. The gas chromatograph was then used to monitor the $CH_4$ concentration. As shown in FIG. 16, five 50 μL chromatography measurements were obtained to determine the initial $CH_4$ concentration within the reactor using a standard curve. After the reactor was exposed to either UV or visible radiation for 3 h, five more 50 μL chromatography measurements were then obtained to determine the final $CH_4$ concentration. The photo-reduction activity reported is the difference between the average final $CH_4$ concentrations and average initial $CH_4$ concentrations.

3.2 Source of Carbon in the $CH_4$ Produced

Additional control experiments were performed to ensure that $CO_2$ was indeed the source of carbon for the $CH_4$ produced. A 0.55 weight % SEG-P25 film was simultaneously purged with $H_2O$-saturated nitrogen ($N_2$) while irradiated with UV light within the reactor. The reactor was then closed off, and the concentration of $CH_4$ was measured after exposure to UV radiation for an additional 3 hour. A minimal amount of $CH_4$ (0.177 μmol/m$^2$ hr) was detected. A 1-hour $H_2O$-saturated $CO_2$ purge was then performed, and the concentration of $CH_4$ evolved from the film was measured. Following the $N_2$ purge, about 78% of the photoactivity (5.31 out of 6.82 μmol/m$^2$ hr) was restored, indicating that the vast majority of $CH_4$ was produced from gaseous $CO_2$ as opposed to other adventitious sources of carbon.

Many applications can be found for the present invention. For examples, chemically pristine graphene-nanoparticle composites deposited from stable highly concentrated inks have a broad range of applications. In particular, the more homogenous atomic structure and superior electronic properties of pristine graphene can enhance the performance of composite biological and chemical sensors and electroactive tissue scaffolds. In energy applications, the superior catalytic reactivity of composites based on pristine graphene can enhance the photocatalytic degradation of gas and liquid phase organic contaminants as well as the production of solar chemical fuels. Additionally, platinum-graphene nanocomposites have potential to serve as an effective counter-electrode in dye sensitized solar cells. In energy storage applications, the outstanding chemical resistance and electronic conductivity of graphene nanocomposites will likely enable its use in next-generation lithium ion batteries.

Example Two

1. Low Dimensional Nanomaterial Synthesis and Processing

Single walled carbon nanotubes (SWCNT, Carbon Solutions Inc, P2) were dispersed at 0.5 mg/ml in 1 weight % ethyl cellulose (EC)-ethanol solutions using a Fisher Scientific sonic dismembrator 500 for 1 hour at 35% power. Solvent exfoliated graphene (SEG) was produced from natural graphite flakes (Asbury Carbon, 3061) in 0.25 weight % EC-ethanol solutions using a Bransonic 3510 tabletop ultrasonic cleaner for 3 hours at 40 kHz and 100 W. This sonicated dispersion was then collected into 250 mL centrifuge tubes and sedimented in a large volume centrifuge (Beckman Coulter Avanti J-26 XP Centrifuge) for 4.5 hours at 7500 rpm with an average relative centrifugal force of 6804 g. The resulting supernatant consisted primarily of single and few layer graphene sheets at about 0.1 mg/ml, as measured using a Varian Cary 5000 spectrophotometer and an absorbance coefficient of 3397 L/g·m at 550 nm.[74]

Figure 17:
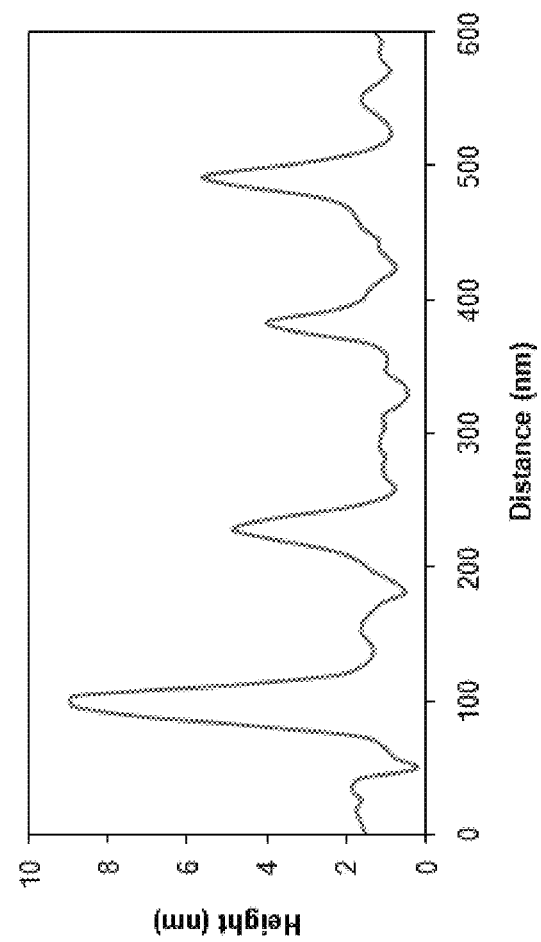
FIG. 17 shows an atomic force micrograph and line scan of SWCNTs deposited from a diluted SWCNT ink after annealing at 400° C. for 30 minutes in air according to one embodiment of the present invention.
Figure 17:
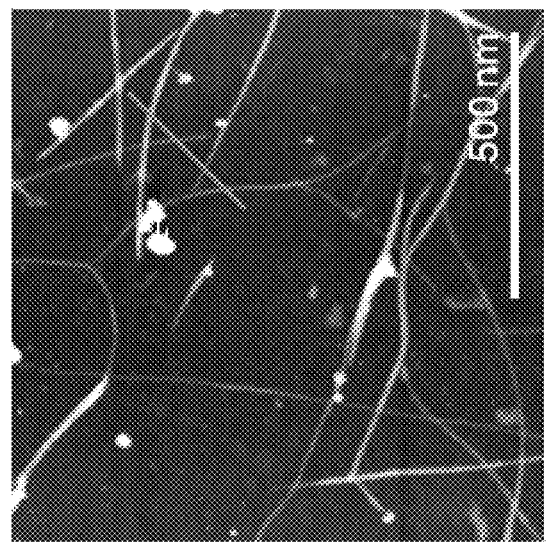
Figure 18:
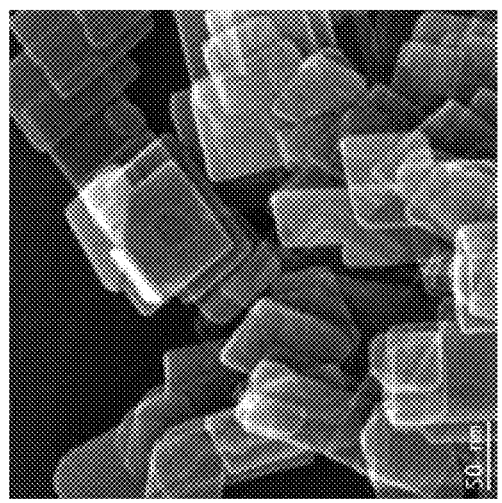
FIG. 18 shows scanning electron micrographs of annealed SWCNT and SEG thin films and dark field transmission electron micrograph of TiNS according to one or more embodiments of the present invention, where (A) shows the annealed SWCNT thin films, (B) shows the annealed SEG thin films, and (C) shows the dark field transmission electron micrograph of TiNS showing their 2D geometry.
Figure 18:
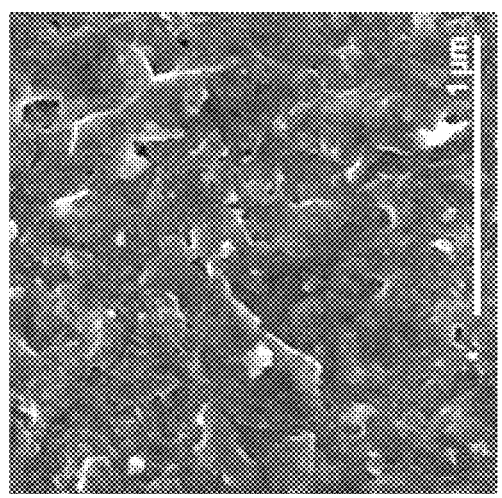
Figure 18:
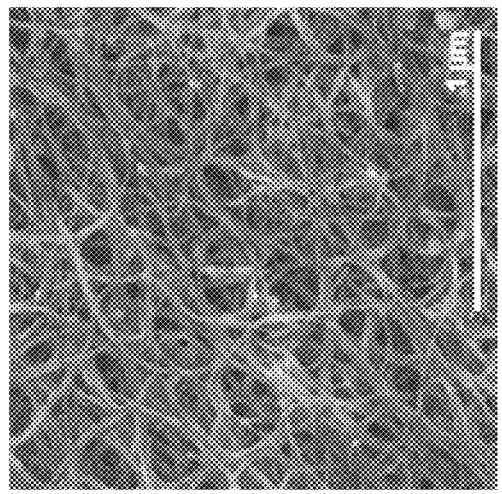

FIG. 17 shows an atomic force micrograph and line scan of SWCNTs deposited from a diluted SWCNT ink after annealing at 400° C. for 30 minutes in air according to one embodiment of the present invention. FIG. 18 shows scanning electron micrographs of annealed SWCNT and SEG thin films and dark field transmission electron micrograph of TiNS according to one or more embodiments of the present invention, where (A) shows the annealed SWCNT thin films, (B) shows the annealed SEG thin films, and (C) shows the dark field transmission electron micrograph of TiNS showing their 2D geometry.

Concentrated SWCNT and SEG inks were produced following solvent exchange in terpineol,[75] yielding final ink concentrations of 1.18 mg/ml and 0.31 mg/ml, respectively. SWCNT was deposited from the concentrated SWCNT ink onto a 3-aminopropyl triethoxysilane (ATPES) functionalized 100 nm thick oxide silicon wafer for atomic force microscopy (AFM) imaging. As shown in FIG. 17, the AFM and corresponding line scan point to a well-dispersed SWCNT ink, with both individually dispersed SWCNTs and small SWCNT bundles. Previously published work contains detailed AFM analysis for concentrated SEG inks.[75] Both SWCNT and SEG inks were then blade coated onto 2.54 cm×2.54 cm glass slides. Following annealing at 400° C. for 30 min in air, scanning electron microscopy (SEM) of the resulting SWCNT and SEG thin films reveal their 1D and 2D structures, as shown in FIGS. 18(A) and 18(B).

Titania nanosheets (TiNS) were produced from 20 ml of titanium butoxide (97%, Aldrich Chemicals) and 2.8 ml of hydrofluoric acid (47%, Mallinckrodt Chemicals).[76] Following 30 minutes of mixing, the solution was placed in an oven for 24 hours at 200° C. under hydrothermal conditions. The TiNS precipitate was rinsed repeatedly with ethanol, deionized water, and 100 ml of 0.1 M sodium hydroxide solution until pH 7 was achieved. As shown in FIG. 18(C), transmission electron microscopy (TEM) of these TiNS confirms their 2D structure. A 22.8 weight % TiNS ink was then produced from the precipitate following an established procedure.[77]

The fraction of TiNS (001) surface was calculated based on their SEM-measured lateral dimensions, which range from 50 nm to 130 nm, and thickness of 8 nm, as shown in FIG. 18(C). For the largest TiNS, the fraction of (001) surface area can be as high as 89%, matching previous reports.[76]

$$\frac{2 \cdot (130 \text{ nm})^2}{2 \cdot (130 \text{ nm})^2 + 4 \cdot (130 \text{ nm} \cdot 8 \text{ nm})^2} = 0.89$$

2. Nanocarbon-Titania Nanosheet Composite Thin Films

Figure 19:
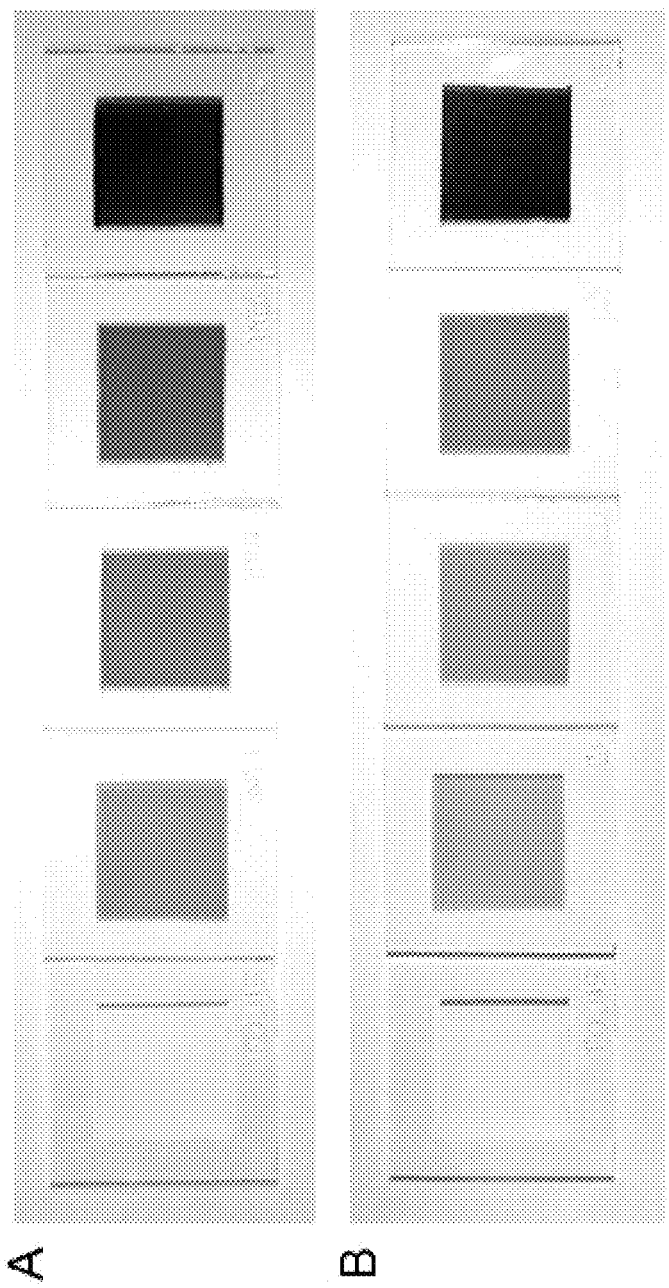
FIG. 19 shows photographs of annealed TiNS nanocomposite thin films on 2.54 cm×2.54 cm silica glass slides according to one or more embodiments of the present invention, where (A) shows the annealed TiNS nanocomposite thin films ranging from 0, 0.25, 0.5, 1, and 100 weight % SEG (left to right) and (B) shows the annealed TiNS nanocomposite thin films ranging from 0, 0.25, 0.5, 1, and 100 weight % SWCNT (left to right).

FIG. 19 shows photographs of annealed TiNS nanocomposite thin films on 2.54 cm×2.54 cm silica glass slides according to one or more embodiments of the present invention, where (A) shows the annealed TiNS nanocomposite thin films ranging from 0, 0.25, 0.5, 1, and 100 weight % SEG (left to right) and (B) shows the annealed TiNS nanocomposite thin films ranging from 0, 0.25, 0.5, 1, and 100 weight % SWCNT (left to right). To form mechanically robust nanocomposite thin films, as shown in FIG. 19, physical mixtures of SWCNT, SEG, and TiNS inks were blade coated onto silica glass slides and annealed at 400° C. for 30 minutes in air. Each nanocomposite film was approximately 2 cm². Their consistent areas and transparent glass substrates facilitate photocatalytic and optical extinction measurements.

Figure 20:
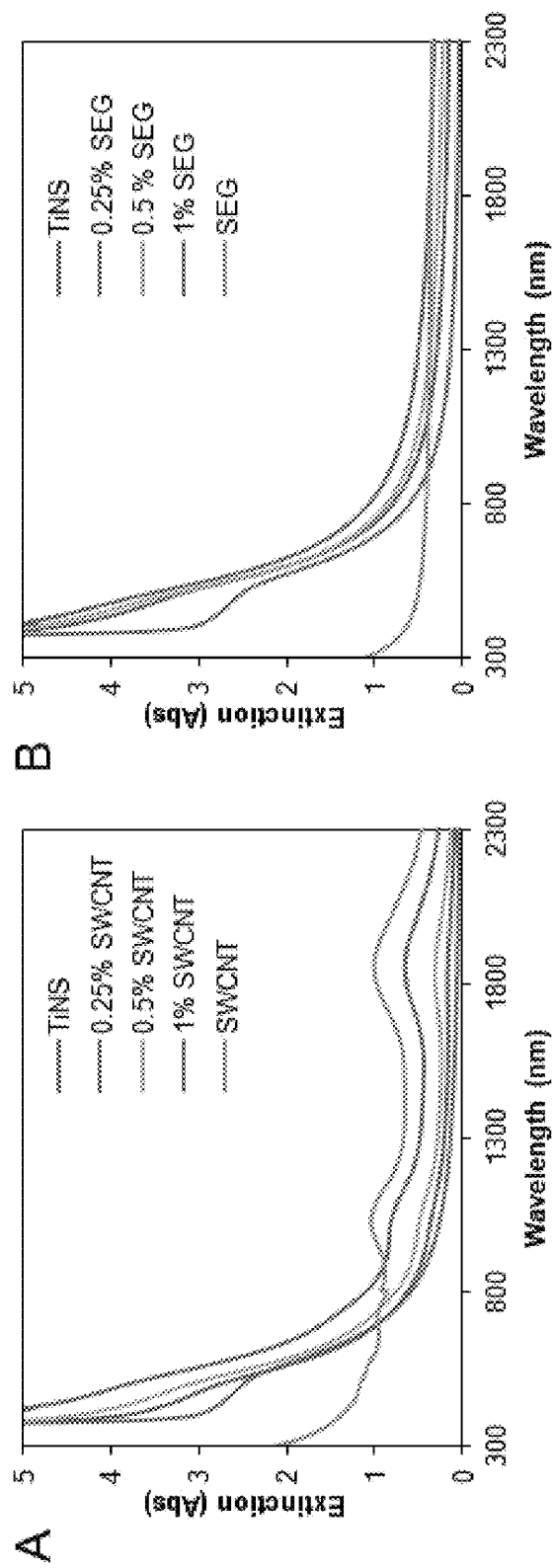
FIG. 20 shows UV-vis-NIR absorbance spectra for annealed SWCNT-TiNS and (B) SEG-TiNS nanocomposite thin films at various compositions according to one or more embodiments of the present invention, where (A) shows the UV-vis-NIR absorbance spectra of the annealed SWCNT-TiNS nanocomposite thin films, and (B) shows the UV-vis-NIR absorbance spectra of the annealed SEG-TiNS nanocomposite thin films.

FIG. 20 shows UV-vis-NIR absorbance spectra for annealed SWCNT-TiNS and (B) SEG-TiNS nanocomposite thin films at various compositions according to one or more embodiments of the present invention, where (A) shows the UV-vis-NIR absorbance spectra of the annealed SWCNT-TiNS nanocomposite thin films, and (B) shows the UV-vis-NIR absorbance spectra of the annealed SEG-TiNS nanocomposite thin films. As shown in FIG. 20, optical extinctions of nanocomposite thin films at each composition were then measured using the Varian Cary 5000 spectrophotometer. Due to their 1D geometry, SWCNTs possess optoelectronic van Hove singularities that provide increased optical absorption in the visible and infrared spectrum. Correspondingly, SWCNT and SWCNT-TiNS nanocomposite thin films absorbed more visible and infrared light compared to their analogous SEG and SEG-TiNS nanocomposite thin films. The spectral signature of the SWCNT film also confirms the heterogeneous electronic structure of the as-produced SWCNTs used in this study. In particular, the SWCNT $S_{22}$ peaks at about 1000 nm, assigned to the semiconducting species, are approximately twice the area of the SWCNT $M_{11}$ peaks at about 700 nm, assigned to the metallic species.[78]

Figure 21:
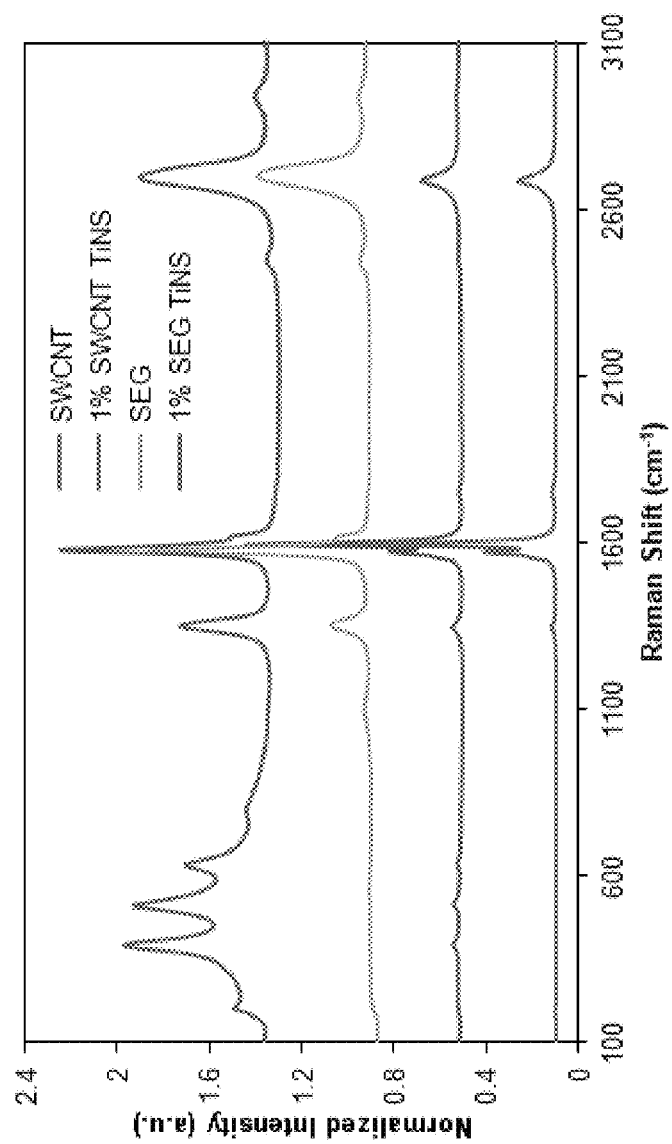
FIG. 21 shows vertically offset average Raman spectra of annealed SWCNT, 1 weight % SWCNT-TiNS nanocomposite, SEG, and 1 weight % SEG-TiNS nanocomposite thin films according to one or more embodiments of the present invention.

FIG. 21 shows vertically offset average Raman spectra of annealed SWCNT, 1 weight % SWCNT-TiNS nanocomposite, SEG, and 1 weight % SEG-TiNS nanocomposite thin films according to one or more embodiments of the present invention. Raman spectra as shown in FIG. 21 were obtained for SWCNT, SWCNT-TiNS, SEG, and SEG-TiNS thin films deposited on silica glass slides from EC-stabilized inks after annealing at 400° C. for 30 minutes in air using a Renishaw inVia Raman microscope with an excitation wavelength of 514 nm. As shown in FIG. 21, five spectra were obtained on different areas of each film and combined to form a representative Raman spectrum for the entire film. The low intensity ratios between the D and G bands, I(D)/I(G), for these annealed films indicate that few defects were introduced through nanocomposite formation. In particular, the SWCNT, SWCNT-TiNS, SEG, and SEG-TiNS films had averaged I(D)/I(G) of 0.02, 0.05, 0.17, and 0.43, respectively.

Figure 22:
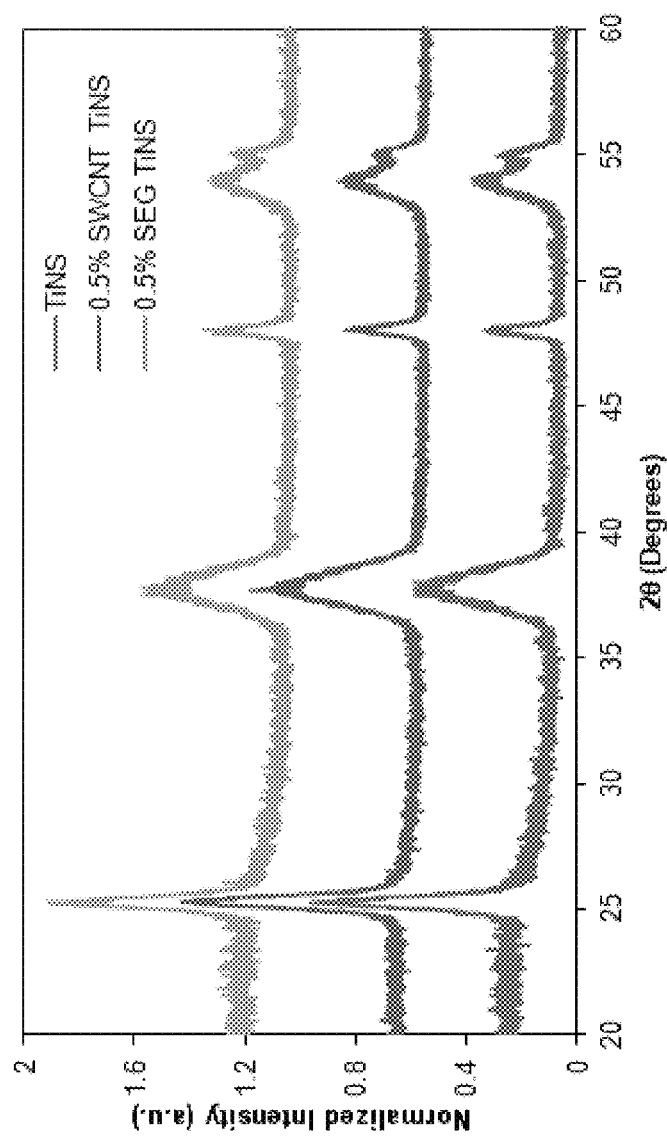
FIG. 22 shows vertically offset glancing angle X-ray diffraction (XRD) of annealed TiNS, 0.5 weight % SWCNT-TiNS nanocomposite, and 0.5 weight % SEG-TiNS nanocomposite thin films according to one or more embodiments of the present invention.

FIG. 22 shows vertically offset glancing angle X-ray diffraction (XRD) of annealed TiNS, 0.5 weight % SWCNT-TiNS nanocomposite, and 0.5 weight % SEG-TiNS nanocomposite thin films according to one or more embodiments of the present invention. As shown in FIG. 22, glancing angle X-ray diffraction (XRD) was performed on TiNS, SWCNT-TiNS nanocomposite, and SEG-TiNS nanocomposite thin films. The resulting spectra were indexed to anatase titania ($TiO_2$),[76] showing that phase transformation did not occur for any of the films during the 400° C. annealing process.

Photoluminescence (PL) spectra of nanocomposite thin films were collected using a commercial photon counting ISS PC-1 Fluorimeter. All measurements were made using a 285 nm excitation wavelength with the film oriented 22.5° orthogonal to the incident light path towards the photon counting detector in a nitrogen atmosphere. 2 mm excitation slits, 1 mm emission slits, and cross-polarizers were used to obtain optimal signal intensity and minimize Raleigh scattering.

3. Nanocomposite Photocatalytic Testing

Figure 23:
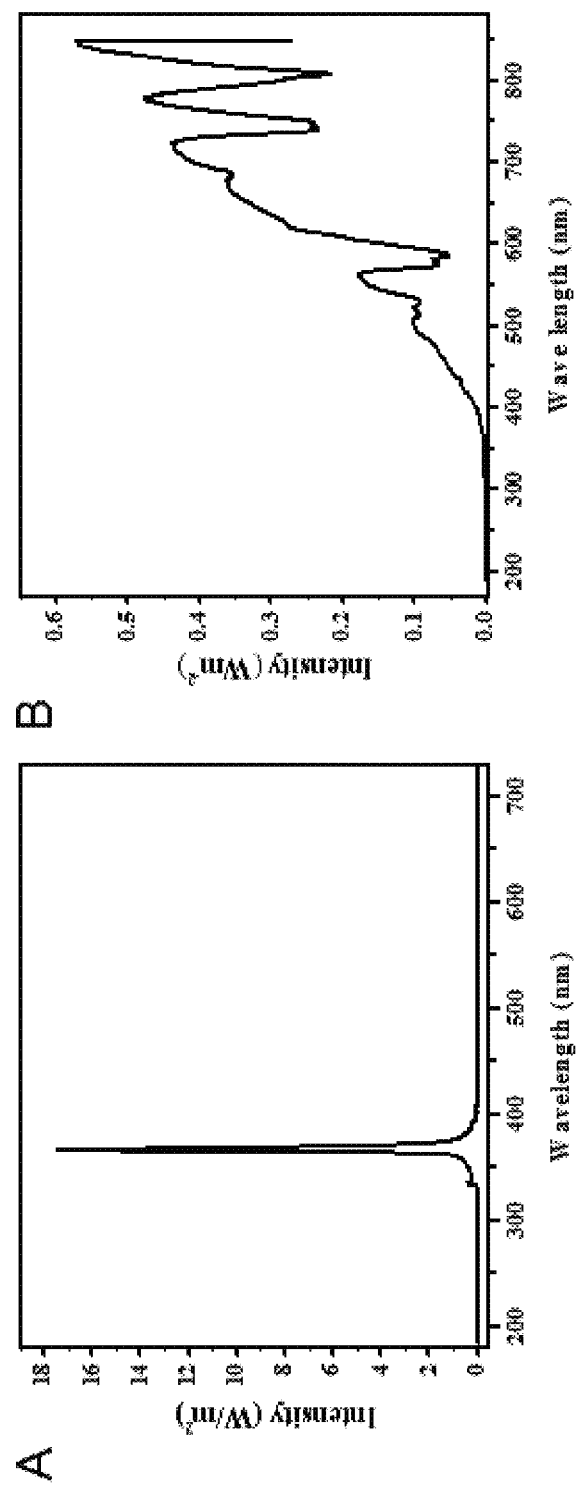
FIG. 23 shows emission spectra of light sources used in photocatalytic testing according to one or more embodiments of the present invention, where (A) shows an emission spectrum of the ultraviolet mercury vapor lamp and (B) shows an emission spectrum of the visible natural daylight bulb used in photocatalytic testing.

FIG. 23 shows emission spectra of light sources used in photocatalytic testing according to one or more embodiments of the present invention, where (A) shows an emission spectrum of the ultraviolet mercury vapor lamp and (B) shows an emission spectrum of the visible natural daylight bulb used in photocatalytic testing. As shown in FIG. 23, photocatalytic reactions were performed using either UV light from a mercury vapor lamp (100 W), with a wavelength of 365 nm and an energy density of about 110 W/m², or a natural daylight bulb (60 W, Halco Lighting, Pure Lite, Neodymium), with wavelengths ranging from about 380 to 850 nm and energy density of about 31 W/m².

Figure 24:
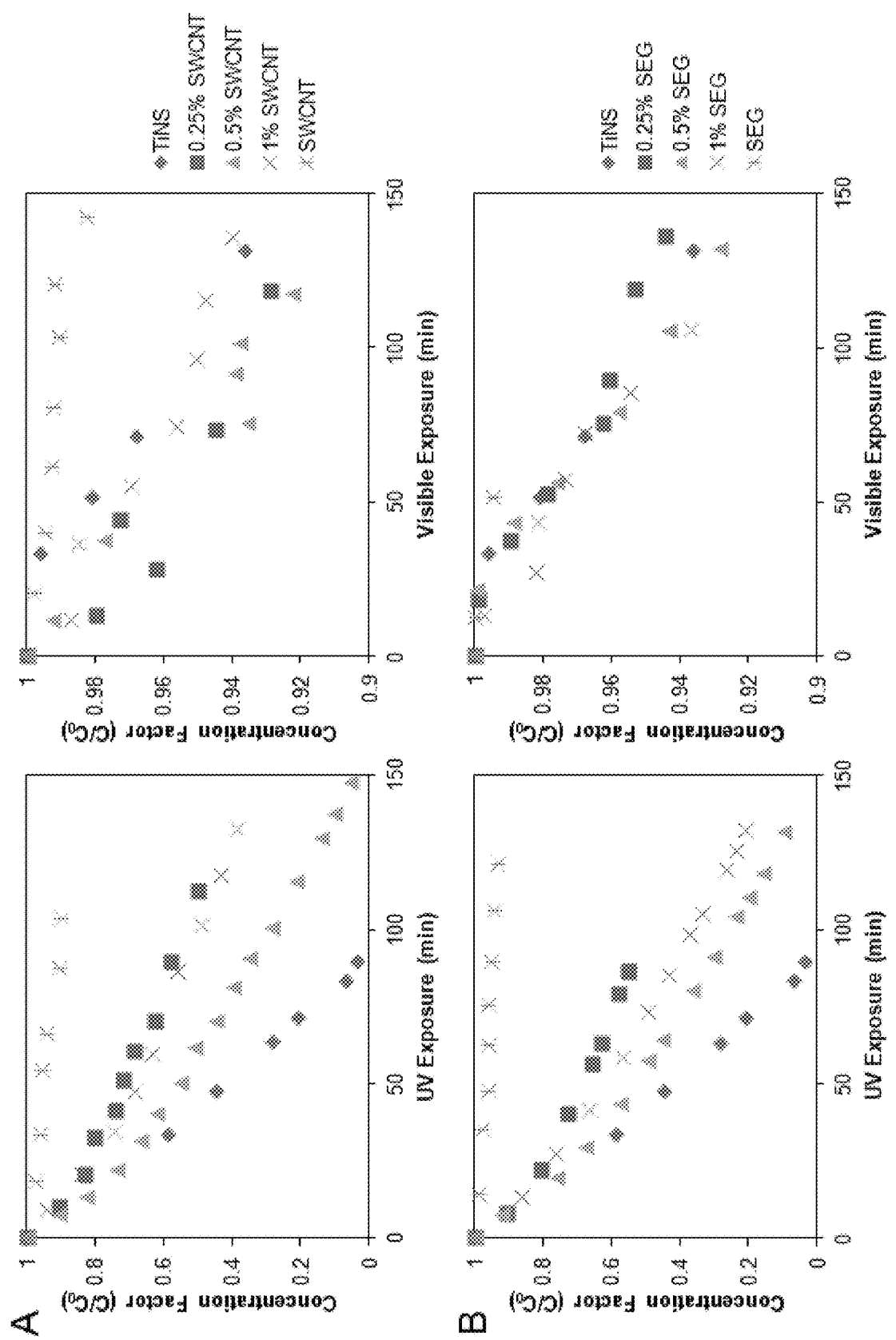
FIG. 24 shows $CH_3CHO$ photo-oxidation on SWCNT-TiNS and SEG-TiNS thin films under UV and visible exposures according to one or more embodiments of the present invention, where (A) shows $CH_3CHO$ photo-oxidation on SWCNT-TiNS thin films at different compositions under UV exposure (left) and visible exposure (right); and (B) shows $CH_3CHO$ photo-oxidation on SEG-TiNS thin films at different compositions under UV exposure (left) and visible exposure (right).

FIG. 24 shows $CH_3CHO$ photo-oxidation on SWCNT-TiNS and SEG-TiNS thin films under UV and visible exposures according to one or more embodiments of the present invention, where (A) shows $CH_3CHO$ photo-oxidation on SWCNT-TiNS thin films at different compositions under UV exposure (left) and visible exposure (right); and (B) shows $CH_3CHO$ photo-oxidation on SEG-TiNS thin films at different compositions under UV exposure (left) and visible exposure (right). Photo-oxidation reactions were performed in a 25 ml Teflon chamber with a quartz window 1 hour after injecting 0.5 mL of acetaldehyde ($CH_3CHO$) vapor in the dark at room temperature. As shown in FIG. 24, a Hewlett Packard 5890 gas chromatograph with a flame ionizing detector was used to monitor the $CH_3CHO$ concentrations.

Photo-reduction of carbon dioxide ($CO_2$) to methane ($CH_4$) was also performed in a 25 ml Teflon chamber. The chamber was purged initially with $H_2O$-saturated $CO_2$ (99.99%) at room temperature for 1 hour. The gas chromatograph was then used to monitor the $CH_4$ concentrations. Five 50 μL chromatography measurements were obtained to determine both the initial $CH_4$ concentration and $CH_4$ concentration after 3 hours of either ultraviolet or visible exposure. The photo-reduction activity reported is the difference between the average final $CH_4$ concentrations and average initial $CH_4$ concentrations.

In sum, one aspect of the disclosure relates to a method of making non-covalently bonded carbon-titania nanocomposite thin films, which includes: forming a carbon-based ink; forming a $TiO_2$ solution; blade-coating a mechanical mixture of the carbon-based ink and the titania solution onto a substrate; and annealing the blade-coated substrate at a first temperature for a first period of time to obtain the carbon-based titania nanocomposite thin films. In certain embodiments, the carbon-based ink may include a concentrated SEG ink, or a concentrated SWCNT ink.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES (1) Fujishima, A.; Honda, K. *Nature* 1972, 238, 37-38.
(2) Linsebigler, A. L.; Lu, G.; Yates, J. T. *Chem. Rev.* 1995, 95, 735-758.
(3) Roy, S. C.; Varghese, 0. K.; Paulose, M.; Grimes, C. A. *ACS Nano* 2010, 4, 1259-1278.
(4) Inoue, T.; Fujishima, A.; Konishi, S.; Honda, K. *Nature* 1979, 277, 637-638.
(5) Hurum, D. C.; Agrios, A. G.; Gray, K. A.; Rajh, T.; Thurnauer, M. C. *J. Phys. Chem. B* 2003, 107, 4545-4549.
(6) Yao, Y.; Li, G.; Ciston, S.; Lueptow, R. M.; Gray, K. A. *Environ. Sci. Technol.* 2008, 42, 4952-4957.
(7) Zhang, H.; Lv, X.; Li, Y.; Wang, Y.; Li, J. *ACS Nano* 2009, 4, 380-386.
(8) Novoselov, K. S.; Geim, A. K.; Morozov, S. V.; Jiang, D.; Zhang, Y.; Dubonos, S. V.; Grigorieva, I. V.; Firsov, A. A. *Science* 2004, 306, 666-669.
(9) Lee, C.; Wei, X.; Kysar, J. W.; Hone, J. *Science* 2008, 321, 385-388.
(10) Woan, K.; Pyrgiotakis, G.; Sigmund, W. *Adv. Mater.* 2009, 21, 2233-2239.
(11) Zhang, Y.; Tang, Z.-R.; Fu, X.; Xu, Y.-J. *ACS Nano* 2010, 4, 7303-7314.
(12) Ng, Y. H.; Lightcap, I. V.; Goodwin, K.; Matsumura, M.; Kamat, P. V. *J. Phys. Chem. Lett.* 2010, 1, 2222-2227.
(13) Liang, Y. T.; Hersam, M. C. *J. Am. Chem. Soc.* 2010, 132, 17661-17663.
(14) Dubin, S.; Gilje, S.; Wang, K.; Tung, V. C.; Cha, K.; Hall, A. S.; Farrar, J.; Varshneya, R.; Yang, Y.; Kaner, R. B. *ACS Nano* 2010, 4, 3845-3852.
(15) Gao, W.; Alemany, L. B.; Ci, L.; Ajayan, P. M. *Nat. Chem.* 2009, 1, 403-408.
(16) Park, S.; An, J.; Jung, I.; Piner, R. D.; An, S. J.; Li, X.; Velamakanni, A.; Ruoff, R. S. *Nano Lett.* 2009, 9, 1593-1597.
(17) Hamilton, C. E.; Lomeda, J. R.; Sun, Z.; Tour, J. M.; Barron, A. R. *Nano Lett.* 2009, 9, 3460-3462.
(18) Hernandez, Y.; Nicolosi, V.; Lotya, M.; Blighe, F. M.; Sun, Z.; De, S.; McGovern, I. T.; Holland, B.; Byrne, M.; Gun'Ko, Y. K.; Boland, J. J.; Niraj, P.; Duesberg, G.; Krishnamurthy, S.; Goodhue, R.; Hutchison, J.; Scardaci, V.; Ferrari, A. C.; Coleman, J. N. *Nat. Nanotechnol.* 2008, 3, 563-568.
(19) Eda, G.; Fanchini, G.; Chhowalla, M. *Nat. Nanotechnol.* 2008, 3, 270-274.
(20) Cote, L. J.; Cruz-Silva, R.; Huang, J. *J. Am. Chem. Soc.* 2009, 131, 11027-11032.
(21) Williams, G.; Seger, B.; Kamat, P. V. *ACS Nano* 2008, 2, 1487-1491.
(22) Gómez-Navarro, C.; Meyer, J. C.; Sundaram, R. S.; Chuvilin, A.; Kurasch, S.; Burghard, M.; Kern, K.; Kaiser, U. *Nano Lett.* 2010, 10, 1144-1148.
(23) Pan, D.; Zhang, J.; Li, Z.; Wu, M. *Adv. Mater.* 2010, 22, 734-738.
(24) Banhart, F.; Kotakoski, J.; Krasheninnikov, A. V. *ACS Nano* 2010, 5, 26-41.
(25) Wang, Y.; Ni, Z.; Liu, L.; Liu, Y.; Cong, C.; Yu, T.; Wang, X.; Shen, D.; Shen, Z. *ACS Nano* 2010, 4, 4074-4080.
(26) Somorjai, G. *Introduction to Surface Chemistry and Catalysis*; Wiley-Interscience, 1994.
(27) Hummers, W. S.; Offeman, R. E. *J. Am. Chem. Soc.* 1958, 80, 1339-1339.
(28) Kamat, P. V. *J. Phys. Chem. Lett.* 2011, 2, 242-251.
(29) Ostojic, G. N.; Liang, Y. T.; Hersam, M. C. *Nanotechnology* 2009, 20, 434019.
(30) Ito, S.; Chen, P.; Comte, P.; Nazeeruddin, M. K.; Liska, P.; Péchy, P.; Grätzel, M. *Prog. Photovoltaics Res. Appl.* 2007, 15, 603-612.
(31) Abazović, N. D.; Čomor, M. I.; Dramićanin, M. D.; Jovanović, D. J.; Ahrenkiel, S. P.; Nedeljković, J. M. *J. Phys. Chem. B* 2006, 110, 25366-25370.
(32) Green, A. A.; Hersam, M. C. *Nano Lett.* 2009, 9, 4031-4036.
(33) Gómez-Navarro, C.; Weitz, R. T.; Bittner, A. M.; Scolari, M.; Mews, A.; Burghard, M.; Kern, K. *Nano Lett.* 2007, 7, 3499-3503.
(34) Engel, M.; Small, J. P.; Steiner, M.; Freitag, M.; Green, A. A.; Hersam, M. C.; Avouris, P. Thin Film Nanotube Transistors Based on Self-Assembled, Aligned, Semiconducting Carbon Nanotube Arrays. *ACS Nano* 2008, 2, 2445-2452.
(35) Lin, Y.-M.; Dimitrakopoulos, C.; Jenkins, K. A.; Farmer, D. B.; Chiu, H.-Y.; Grill, A.; Avouris, P. 100-GHz Transistors from Wafer-Scale Epitaxial Graphene. *Science* 2010, 327, 662.
(36) Ajayan, P. M.; Yakobson, B. I. Graphene: Pushing the Boundaries. *Nat. Mater.* 2011, 10, 415-417.
(37) Tao, A. R.; Habas, S.; Yang, P. Shape Control of Colloidal Metal Nanocrystals. *Small* 2008, 4, 310-325.
(38) Puntes, V. F.; Krishnan, K. M.; Alivisatos, A. P. Colloidal Nanocrystal Shape and Size Control: The Case of Cobalt. *Science* 2001, 291, 2115-2117.
(39) Sofos, M.; Goldberger, J.; Stone, D. A.; Allen, J. E.; Ma, Q.; Herman, D. J.; Tsai, W.-W.; Lauhon, L. J.; Stupp, S. I. A Synergistic Assembly of Nanoscale Lamellar Photoconductor Hybrids. *Nat. Mater.* 2009, 8, 68-75.
(40) Ostojic, G. N.; Liang, Y. T.; Hersam, M. C. Catalytically Active Nanocomposites of Electronically Coupled Carbon Nanotubes and Platinum Nanoparticles Formed via Vacuum Filtration. *Nanotechnology* 2009, 20, 434019.
(41) Wang, C.; Shim, M.; Guyot-Sionnest, P. Electrochromic Nanocrystal Quantum Dots. *Science* 2001, 291, 2390-2392.
(42) Han, X.; Kuang, Q.; Jin, M.; Xie, Z.; Zheng, L. Synthesis of Titania Nanosheets with a High Percentage

(43) Green, A. A.; Hersam, M. C. Emerging Methods for Producing Monodisperse Graphene Dispersions. *J. Phys. Chem. Lett.* 2009, 1, 544-549.

(44) Dean, C. R.; Young, A. F.; Meric, I.; Lee, C.; Wang, L.; Sorgenfrei, S.; Watanabe, K.; Taniguchi, T.; Kim, P.; Shepard, K. L.; Hone, J. Boron Nitride Substrates for High-Quality Graphene Electronics. *Nat. Nanotechnol.* 2010, 5, 722-726.

(45) Yang, H. G.; Sun, C. H.; Qiao, S. Z.; Zou, J.; Liu, G.; Smith, S. C.; Cheng, H. M.; Lu, G. Q. Anatase $TiO_2$ Single Crystals with a Large Percentage of Reactive Facets. *Nature* 2008, 453, 638-641.

(46) Maitani, M. M.; Tanaka, K.; Mochizuki, D.; Wada, Y. Enhancement of Photoexcited Charge Transfer by {001} Facet-Dominating $TiO_2$ Nanoparticles. *J. Phys. Chem. Lett.* 2011, 2, 2655-2659.

(47) Kamat, P. V. Graphene-Based Nanoarchitectures. Anchoring Semiconductor and Metal Nanoparticles on a Two-Dimensional Carbon Support. *J. Phys. Chem. Lett.* 2009, 1, 520-527.

(48) Ng, Y. H.; Lightcap, I. V.; Goodwin, K.; Matsumura, M.; Kamat, P. V. To What Extent Do Graphene Scaffolds Improve the Photovoltaic and Photocatalytic Response of $TiO_2$ Nanostructured Films? *J. Phys. Chem. Lett.* 2010, 1, 2222-2227.

(49) Varghese, O. K.; Paulose, M.; LaTempa, T. J.; Grimes, C. A. High-Rate Solar Photocatalytic Conversion of $CO_2$ and Water Vapor to Hydrocarbon Fuels. *Nano Lett.* 2009, 9, 731-737.

(50) Yao, Y.; Li, G.; Ciston, S.; Lueptow, R. M.; Gray, K. A. Photoreactive $TiO_2$/Carbon Nanotube Composites: Synthesis and Reactivity. *Environ. Sci. Technol.* 2008, 42, 4952-4957.

(51) Lambert, T. N.; Chavez, C. A.; Bell, N. S.; Washburn, C. M.; Wheeler, D. R.; Brumbach, M. T. Large Area Mosaic Films of Graphene-Titania: Self-Assembly at the Liquid-Air Interface and Photoresponsive Behavior. *Nanoscale* 2011, 3, 188-191.

(52) An, X.; Yu, J. C. Graphene-Based Photocatalytic Composites. *RSC Adv.* 2011, 1, 1426-1434.

(53) Liang, Y. T.; Vijayan, B. K.; Gray, K. A.; Hersam, M. C. Minimizing Graphene Defects Enhances Titania Nanocomposite-Based Photocatalytic Reduction of $CO_2$ for Improved Solar Fuel Production. *Nano Lett.* 2011, 11, 2865-2870.

(54) Woan, K.; Pyrgiotakis, G.; Sigmund, W. Photocatalytic Carbon-Nanotube-$TiO_2$ Composites. *Adv. Mater.* 2009, 21, 2233-2239.

(55) Kamat, P. V. Graphene-Based Nanoassemblies for Energy Conversion. *J. Phys. Chem. Lett.* 2011, 2, 242-251.

(56) Zhang, H.; Lv, X.; Li, Y.; Wang, Y.; Li, J. P25-Graphene Composite as a High Performance Photocatalyst. *ACS Nano* 2009, 4, 380-386.

(57) Zhang, Y.; Tang, Z.-R.; Fu, X.; Xu, Y.-J. Engineering the Unique 2D Mat of Graphene to Achieve Graphene-$TiO_2$ Nanocomposite for Photocatalytic Selective Transformation: What Advantage Does Graphene Have over Its Forebear Carbon Nanotube? *ACS Nano* 2011, 5, 7426-7435.

(58) Du, A.; Ng, Y. H.; Bell, N. J.; Zhu, Z.; Amal, R.; Smith, S. C. Hybrid Graphene/Titania Nanocomposite: Interface Charge Transfer, Hole Doping, and Sensitization for Visible Light Response. *J. Phys. Chem. Lett.* 2011, 2, 894-899.

(59) Zhang, Y.; Tang, Z.-R.; Fu, X.; Xu, Y.-J. $TiO_2$-Graphene Nanocomposites for Gas-Phase Photocatalytic Degradation of Volatile Aromatic Pollutant: Is $TiO_2$-Graphene Truly Different from Other $TiO_2$-Carbon Composite Materials? *ACS Nano* 2010, 4, 7303-7314.

(60) Liang, Y. T.; Hersam, M. C. Towards Rationally Designed Graphene-Based Materials and Devices. *Macromol. Chem. Phys.* 2012. DOI: 10.1002/macp.201100572.

(61) Xiang, Q.; Yu, J.; Jaroniec, M. Synergetic Effect of $MoS_2$ and Graphene as Cocatalysts for Enhanced Photocatalytic $H_2$ Production Activity of $TiO_2$ Nanoparticles. *J. Am. Chem. Soc.* 2012, 134, 6575-6578.

(62) Yu, J.; Ma, T.; Liu, S. Enhanced Photocatalytic Activity of Mesoporous $TiO_2$ Aggregates by Embedding Carbon Nanotubes as Electron-Transfer Channel. *Phys. Chem. Chem. Phys.* 2011, 13, 3491-3501.

(63) Xiang, Q.; Yu, J.; Jaroniec, M. Graphene-Based Semiconductor Photocatalysts. *Chem. Soc. Rev.* 2012, 41, 782-796.

(64) Lambert, T. N.; Chavez, C. A.; Hernandez-Sanchez, B.; Lu, P.; Bell, N. S.; Ambrosini, A.; Friedman, T.; Boyle, T. J.; Wheeler, D. R.; Huber, D. L. Synthesis and Characterization of Titania-Graphene Nanocomposites. *J. Phys. Chem. C* 2009, 113, 19812-19823.

(65) Xiang, Q.; Yu, J.; Jaroniec, M. Enhanced Photocatalytic $H_2$-Production Activity of Graphene-Modified Titania Nanosheets. *Nanoscale* 2011, 3, 3670-3678.

(66) Williams, G.; Seger, B.; Kamat, P. V. $TiO_2$-Graphene Nanocomposites. UV-Assisted Photocatalytic Reduction of Graphene Oxide. *ACS Nano* 2008, 2, 1487-1491.

(67) Liang, Y. T.; Hersam, M. C. Highly Concentrated Graphene Solutions via Polymer Enhanced Solvent Exfoliation and Iterative Solvent Exchange. *J. Am. Chem. Soc.* 2010, 132, 17661-17663.

(68) Ito, S.; Chen, P.; Comte, P.; Nazeeruddin, M. K.; Liska, P.; Péchy, P.; Grätzel, M. Fabrication of Screen-Printing Pastes from $TiO_2$ Powders for Dye-Sensitised Solar Cells. *Prog. Photovoltaics Res. Appl.* 2007, 15, 603-612.

(69) Abazović, N. D.; Čomor, M. I.; Dramićanin, M. D.; Jovanović, D. J.; Ahrenkiel, S. P.; Nedeljković, J. M. Photoluminescence of Anatase and Rutile $TiO_2$ Particles†. *J. Phys. Chem. B* 2006, 110, 25366-25370.

(70) Zhou, J. K.; Lv, L.; Yu, J.; Li, H. L.; Guo, P.-Z.; Sun, H.; Zhao, X. S. Synthesis of Self-Organized Polycrystalline F-doped $TiO_2$ Hollow Microspheres and Their Photocatalytic Activity under Visible Light. *J Phys. Chem. C* 2008, 112, 5316-5321.

(71) Hersam, M. C. Progress Towards Monodisperse Single-Walled Carbon Nanotubes. *Nat. Nanotechnol.* 2008, 3, 387-394.

(72) Kinder, J. M.; Mele, E. J. Nonradiative Recombination of Excitons in Carbon Nanotubes Mediated by Free Charge Carriers. *Phys. Rev. B* 2008, 78, 155429.

(73) Bahr, J. L.; Tour, J. M. Covalent Chemistry of Single-Wall Carbon Nanotubes. *Mater. Chem.* 2002, 12, 1952-1958.

(74) Liang, Y. T.; Vijayan, B. K.; Gray, K. A.; Hersam, M. C. *Nano Lett.* 2011, 11, 2865-2870.

(75) Liang, Y. T.; Hersam, M. C. *J. Am. Chem. Soc.* 2010, 132, 17661-17663.

(76) Han, X.; Kuang, Q.; Jin, M.; Xie, Z.; Zheng, L. *J. Am. Chem. Soc.* 2009, 131, 3152-3153.

(77) Ito, S.; Chen, P.; Comte, P.; Nazeeruddin, M. K.; Liska, P.; Péchy, P.; Grätzel, M. *Prog. Photovoltaics Res. Appl.* 2007, 15, 603-612.

(78) Arnold, M. S.; Green, A. A.; Hulvat, J. F.; Stupp, S. I.; Hersam, M. C. *Nat. Nanotechnol.* 2006, 1, 60-65.

What is claimed is:

1. A dye sensitized solar cell, comprising:
    a counter-electrode comprising carbon-titania nanocomposite thin films that are made by:
        forming a carbon-based ink, wherein the carbon-based ink comprises a concentrated solvent-exfoliated graphene (SEG) ink;
        forming a titania solution containing titanium dioxide ($TiO_2$);
        blade-coating a mechanical mixture of the concentrated SEG ink and the titania solution onto a substrate; and
        annealing the blade-coated substrate at a first temperature for a first period of time to obtain the SEG-TiO nanocomposite thin films,
    wherein the SEG-$TiO_2$ nanocomposite thin films comprise a homogenous structure and a porous network of SEG nanoplatelets decorated with $TiO_2$ particles, wherein the SEG nanoplatelets and the $TiO_2$ particles are non-covalently bonded to each other in the SEG-$TiO_2$ nanocomposite thin films, and wherein the SEG-$TiO_2$ nanocomposite thin films comprises 0.25-2.15 weight % of the SEG; and
    wherein the SEG nanoplatelets are characterized with a first intensity ratio of a peak intensity at a D-band at about 1350 $cm^{-1}$ to a peak intensity at a G-band at about 1590 $cm^{-1}$ of a Raman spectrum of the SEG nanoplatelets, which is a measure of a relative concentration of $sp^3$ hybridized defects compared to $sp^2$ hybridized graphene domains, wherein the first intensity ratio has an average value of 0.17.

2. The dye sensitized solar cell of claim 1, wherein the first temperature is about 350-450° C., and the first period of time is about 20-45 minutes.

3. The dye sensitized solar cell of claim 1, wherein the forming of the concentrated SEG ink comprises:
    adding natural graphite to an ethyl-cellulose (EC)-ethanol solution to form a second graphite solution;
    sonicating the second graphite solution at a second frequency for a fourth period of time;
    centrifuging the sonicated second graphite solution for a fifth period of time at a second rotation speed to obtain a SEG supernatant; and
    disposing the SEG supernatant in terpineol to perform solvent exchange and to form the concentrated SEG ink.

4. The dye sensitized solar cell of claim 3, wherein the fourth period of time is about 2.5-3.5 hours, the first frequency is about 30-50 kHz, the fifth period of time is about 3-6 hours, and the second rotation speed is about 6000-9000 rpm.

5. The dye sensitized solar cell of claim 1, wherein the titania solution comprises a titania nanosheet (TiNS) ink.

6. The dye sensitized solar cell of claim 5, wherein the forming of the TiNS ink comprises:
    mixing a third amount of titanium butoxide with a fourth amount of hydrofluoric acid for a seventh period of time to form a mixed solution;
    heating the mixed solution at a second temperature for an eighth period of time under hydrothermal conditions; and
    rinsing the heated mixed solution to obtain the TiNS ink.

7. The dye sensitized solar cell of claim 6, wherein the third amount is about 15-25 ml, the fourth amount is about 2.5-3.2 ml, the seventh period of time is about 20-45 minutes, the second temperature is about 175-225° C., and the eighth period of time is about 20-28 hours.

8. The SEG-$TiO_2$ nanocomposite thin film of claim 1, wherein a second intensity ratio of a peak intensity at a D-band at about 1350 $cm^{-1}$ to a peak intensity at a G-band at about 1590 $cm^{-1}$ of a Raman spectrum of the SEG-$TiO_2$ nanocomposite thin film is less than 1.

\* \* \* \* \*